US012322453B2

(12) United States Patent
Tang et al.

(10) Patent No.: US 12,322,453 B2
(45) Date of Patent: Jun. 3, 2025

(54) NAND IO BANDWIDTH INCREASE

(71) Applicant: SanDisk Technologies LLC, Addison, TX (US)

(72) Inventors: Tianyu Tang, Milpitas, CA (US); Venkatesh Prasad Ramachandra, San Jose, CA (US); Siddhesh Darne, Milpitas, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 81 days.

(21) Appl. No.: 17/898,386

(22) Filed: Aug. 29, 2022

(65) Prior Publication Data

US 2024/0071519 A1    Feb. 29, 2024

(51) Int. Cl.
*G11C 16/26* (2006.01)
*G06F 3/06* (2006.01)
*G11C 16/04* (2006.01)
*G11C 16/10* (2006.01)
*G11C 16/32* (2006.01)

(52) U.S. Cl.
CPC .......... *G11C 16/26* (2013.01); *G06F 3/0635* (2013.01); *G06F 3/0679* (2013.01); *G11C 16/0483* (2013.01); *G11C 16/10* (2013.01); *G11C 16/32* (2013.01)

(58) Field of Classification Search
CPC ..... G11C 16/26; G11C 16/0483; G11C 16/10; G11C 16/32; G06F 3/0635; G06F 3/0679
See application file for complete search history.

(56) References Cited

U.S. PATENT DOCUMENTS

| 10,083,725 | B2 * | 9/2018 | Nobunaga | G11C 16/10 |
| 10,418,089 | B2 * | 9/2019 | Zerbe | G11C 7/22 |
| 11,416,169 | B2 * | 8/2022 | Kojima | G06F 3/0604 |
| 2018/0175834 | A1 | 6/2018 | Modi | |
| 2019/0109584 | A1 | 4/2019 | Tang | |

* cited by examiner

*Primary Examiner* — Vanthu T Nguyen
(74) *Attorney, Agent, or Firm* — Sheppard, Mullin, Richter & Hampton LLP

(57) ABSTRACT

The disclosure provides circuits and methods for increasing NAND input/output (I/O) bandwidth during read/write operations. The method includes transmitting a clock signal between a controller I/O circuit and a memory I/O circuit along a read enable bus, transmitting 8 bits of data along an I/O bus, and transmitting 2 bits of data along a data strobe signal (DQS) bus. Transmitting 2 bits of data along the DQS bus includes transmitting a first DQS data signal along the DQS bus and transmitting a first inverse DQS data signal along the DQS bus.

16 Claims, 18 Drawing Sheets

NAND IO BANDWIDTH INCREASE

BACKGROUND

Flash memory is an electronic, non-volatile computer memory storage medium that can be electrically erased and reprogrammed. Flash memory is widely used across a range of products and industries including computers, mobile phones, tablet devices, personal digital assistants (PDAs), digital audio players, digital cameras, video games, scientific instrumentation, industrial robotics, and medical electronics, to name a few. NAND flash memory—one of the two primary types of flash memory—can be found in memory cards, USB flash drives, solid-state drives, smartphones, and the like. NAND flash may employ floating gate transistors, such as floating gate metal-oxide-semiconductor field-effect transistors (MOSFETs), connected in a manner that resembles a NAND logic gate to store a charge which represents a data state.

During conventional read/write operations, I/O data is sent from a controller to the NAND flash memory, and vice versa. Typical read/write operations include latching data during rising and falling edges of DC clock signals. However, conventional read/write operations are limited by the amount of data that can be latched on each clock cycle.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
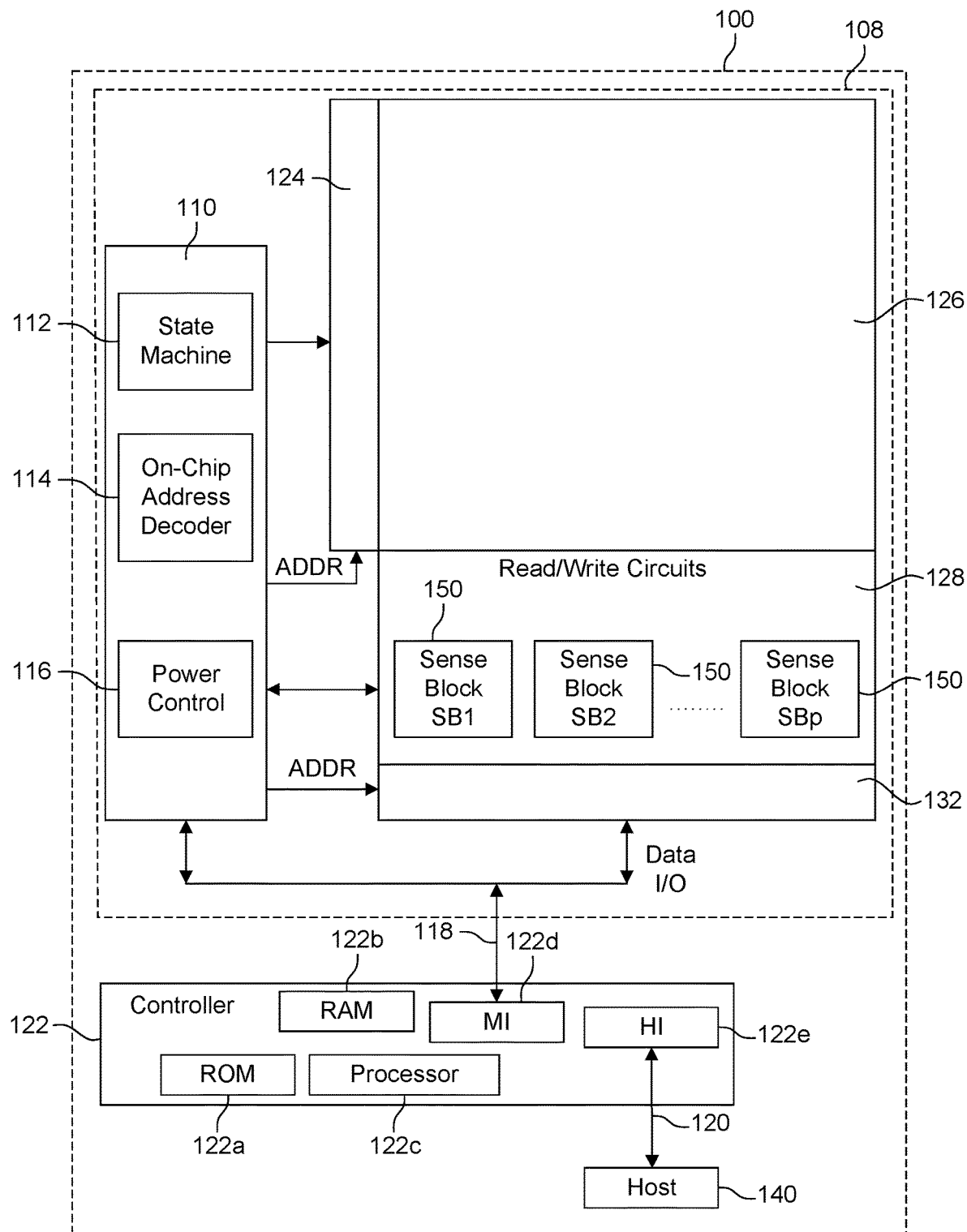
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

During conventional read/write operations, a plurality of signals are transmitted between a controller and a NAND memory along a plurality of buses. Typical signals include one or more clock (CLK) signals transmitted along one or more CLK buses, and one or more data signals transmitted along one or more I/O data buses. During conventional read/write operations, 8-bits of I/O data are latched on each edge of the one or more CLK signals. Since CLK signals typically include DC square waves comprising rising edges and falling edges, 8-bits of data can be latched on each rising and falling edge. For example, during 4 CLK cycles (i.e., 4 square wave CLK signal pulses), 64 bits of I/O data can be latched along the I/O bus. Furthermore, current techniques consist of increasing the amount of I/O data transfer by adding additional I/O buses (sometimes referred to as DQ buses) between the controller and NAND memory. However, although these methods have increased the amount of I/O data transfer, they are limited to latching 8-bits on each edge of the CLK signal.

Unlike the conventional methods, the methods described herein increase the amount of bits that can be latched with each CLK edge of the CLK cycle by transmitting an additional bit along a DQS bus as a data signal on each DQS and BDQS CLK signal edge. By latching 8-bits using I/O data signals, and latching an additional 2-bits using DQS and BDQS data signals (i.e., one bit using the DQS signal, and one bit using the BDQS signal), the methods described herein are able to latch 10-bits of data for each edge of the CLK signal, thus increasing the amount of bits that can be transferred during a clock cycle by about 25 percent. For example, given 4 square wave CLK signal pulses (i.e., 4 clock cycles), 79 bits of I/O data can be latched along the I/O and DQS bus.

In one embodiment, the method for increasing the NAND I/O bandwidth includes transmitting a RE/BRE CLK signal along the RE bus during a write operation. During a typical write operation, DQS/BDQS CLK signals are transmitted from the controller to the NAND memory array along a DQS bus, and RE/BRE CLK signals along the RE bus are maintained in a stable state (i.e., a RE CLK signal is kept at a high voltage (e.g., about 1V), and a BRE CLK signal is kept at a low voltage (e.g., about 0V)). By transmitting CLK signals along the RE bus, the write operation can transmit one additional bit of data as a DQS data signal, and one additional bit of data as a BDQS data signal along the DQS bus in place of the DQS/BDQS CLK signals. Because the BDQS signal is the logical inverse of the DQS signal, each signal can transmit an additional bit of data without signal interference. Thus, during the write operation, the controller can write 10-bits per clock edge in place of 8-bits.

The method is not limited to solely a write operation. In one embodiment, the method for increasing the NAND I/O bandwidth includes transmitting a RE/BRE CLK signal along the RE bus during a read operation, and transmitting two additional bits as DQS/BDQS data signals along the DQS bus. During a typical read operation, a RE/BRE CLK signal is transmitted from the controller to the NAND. After receiving the RE/BRE CLK signal, the NAND transmits I/O data signals to the controller along the I/O bus based on the number of RE/BRE clock signal edges. Furthermore, during the typical read operation, DQS/BDQS CLK signals are used as CLK signals for the controller. However, because the proposed system and method use DQS/BDQS CLK signals as data signals instead of CLK signals, the controller requires an internal CLK (i.e., RE internal CLK) to properly read data from the NAND. By using the DQS/BDQS CLK signals as data signals, the NAND can send two additional bits (i.e., one bit as one DQS data signal, and one bit as one BDQS data signal) along the DQS bus. Thus, during a read operation, the controller can read 10-bits per clock edge in place of 8-bits.

In addition to creating faster data transfer, latching 10-bits of data per clock edge also allows for additional encryption and decryption methods to be used during data transfer. For example, in some configurations, it may be desirable to encode I/O data using a 8 b/10 b encoding scheme. However, because conventional method of data transmission are limited to 8-bits of data per clock edge, transmitting 10-bits of encoded data would require additional clock cycles. By using the methods described herein, the 8 b/10 b encoding scheme could be used without necessitating the need for additional clock cycles. Furthermore, encryption and decryption schemes, such as 8 b/10 b encryption offer solutions to scenarios where data sets that include lone pulses (i.e., lone binary values) can result in weak signals.

FIG. 1 is a block diagram of an example non-volatile memory system 100. In one embodiment, the non-volatile memory system 100 is a card-based system, such as a secure digital (SD) or a micro secure digital (micro-SD) card. In an alternate embodiment, memory system 100 is part of an embedded memory system. For example, the flash memory may be embedded within the host. In other examples, memory system 100 can be a solid state drive (SSD). The non-volatile memory system 100 includes one or more non-volatile memory dies 108, and a controller 122. The memory die 108 can be a complete memory die or a partial memory die. As seen here, the memory die 108 includes a memory structure 126, control circuitry 110, and read/write/erase circuits 128. The memory structure 126 is addressable by wordlines via a row decoder 124 and by bitlines via a column decoder 132. The read/write/erase circuits 128 include multiple sense blocks 150 including SB1, SB2, . . . , SBp (hereinafter referred to as sensing circuitry). The read/write/erase circuits 128 and sensing circuitry allow a page of memory cells to be read, programmed, or erased in parallel.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include 2D arrays, 3D arrays, and other memory structures that may have a string configuration. Although current iterations of other memory structure (e.g., MRAM, PCM, and Spin RAM) are configured without a string, memories of these cells can be configured into a topology that has a string, and thus could be utilized in a format that would allow them to be erased in a block format and programmed in chunks. Thus, in this potential configuration, embodiments of the disclosure could be foreseeably applied.

A person of ordinary skill in the art will recognize that the technology described herein is not limited to a single specific memory structure, but covers many relevant memory structures within the spirit and scope of the technology as described herein and as understood by one of ordinary skill in the art.

The control circuitry 110 cooperates with the read/write/erase circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters. The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The controller 122 interfaces with the one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

In one embodiment, a controller 122 is included in the same package (e.g., a removable storage card) as the memory die 108. In other embodiments, the controller is separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

The controller 122 includes one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c—may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

Figure 2:
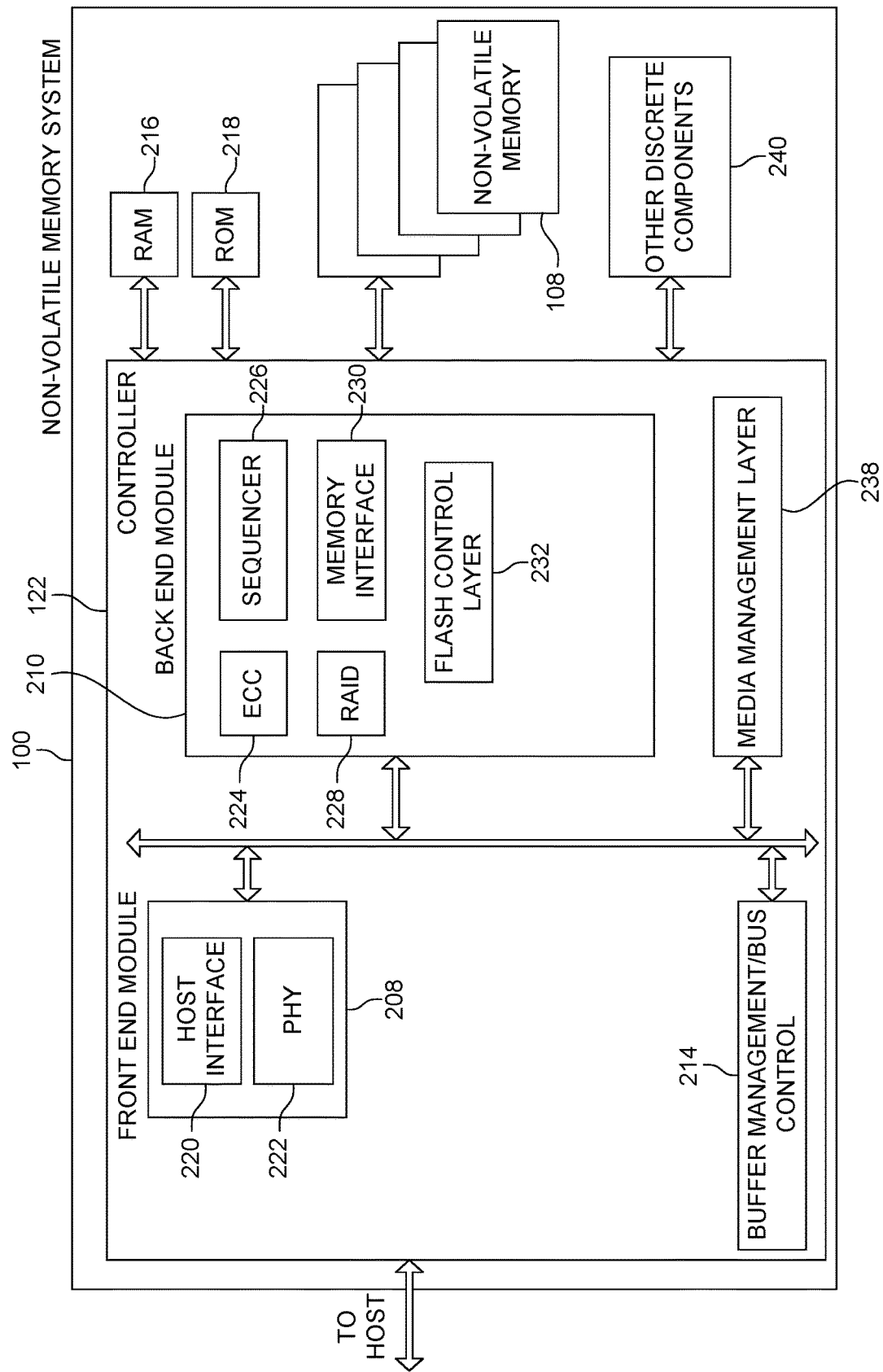
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that the one or more non-volatile memory dies 108 are not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the block can be erased and reused).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fiber Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or greater interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Figure 3:
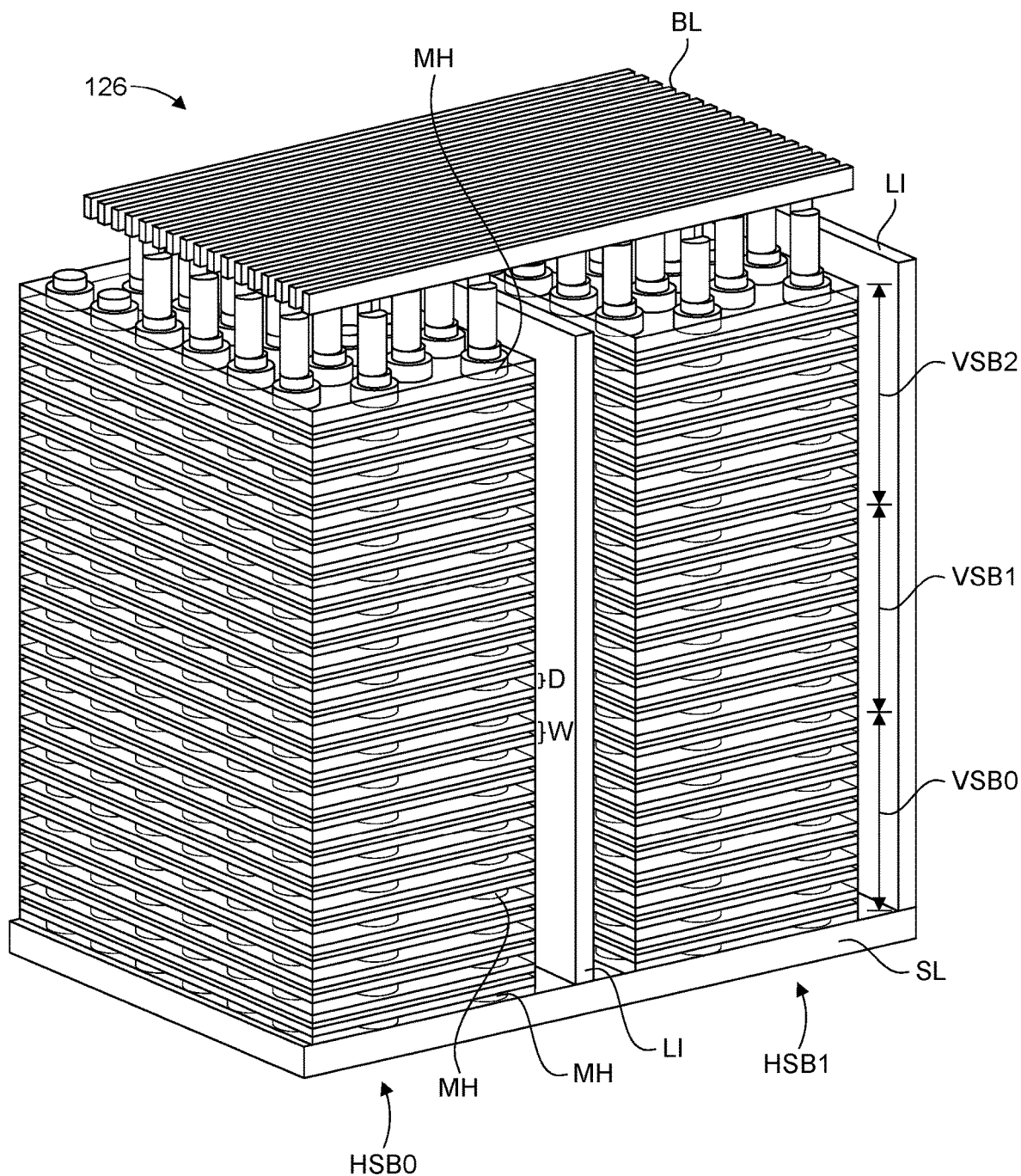
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (i.e., wordline layers) is marked as WL. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating D layers and WL layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2.

Figure 4A:
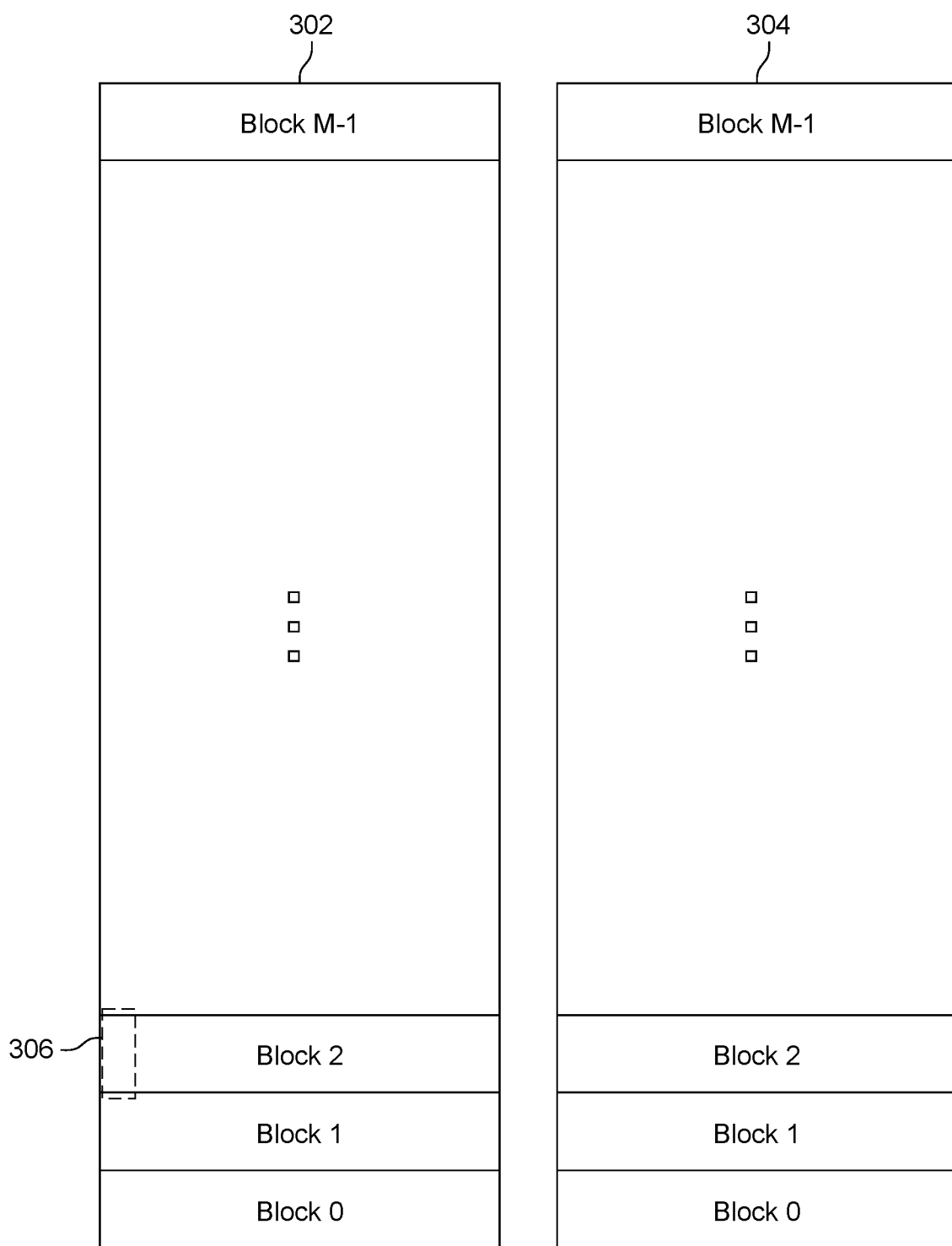
FIG. 4A is a block diagram of an example memory structure having two planes, in connection with which, example embodiments of the disclosed technology can be implemented.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of wordlines.

Figure 4B:
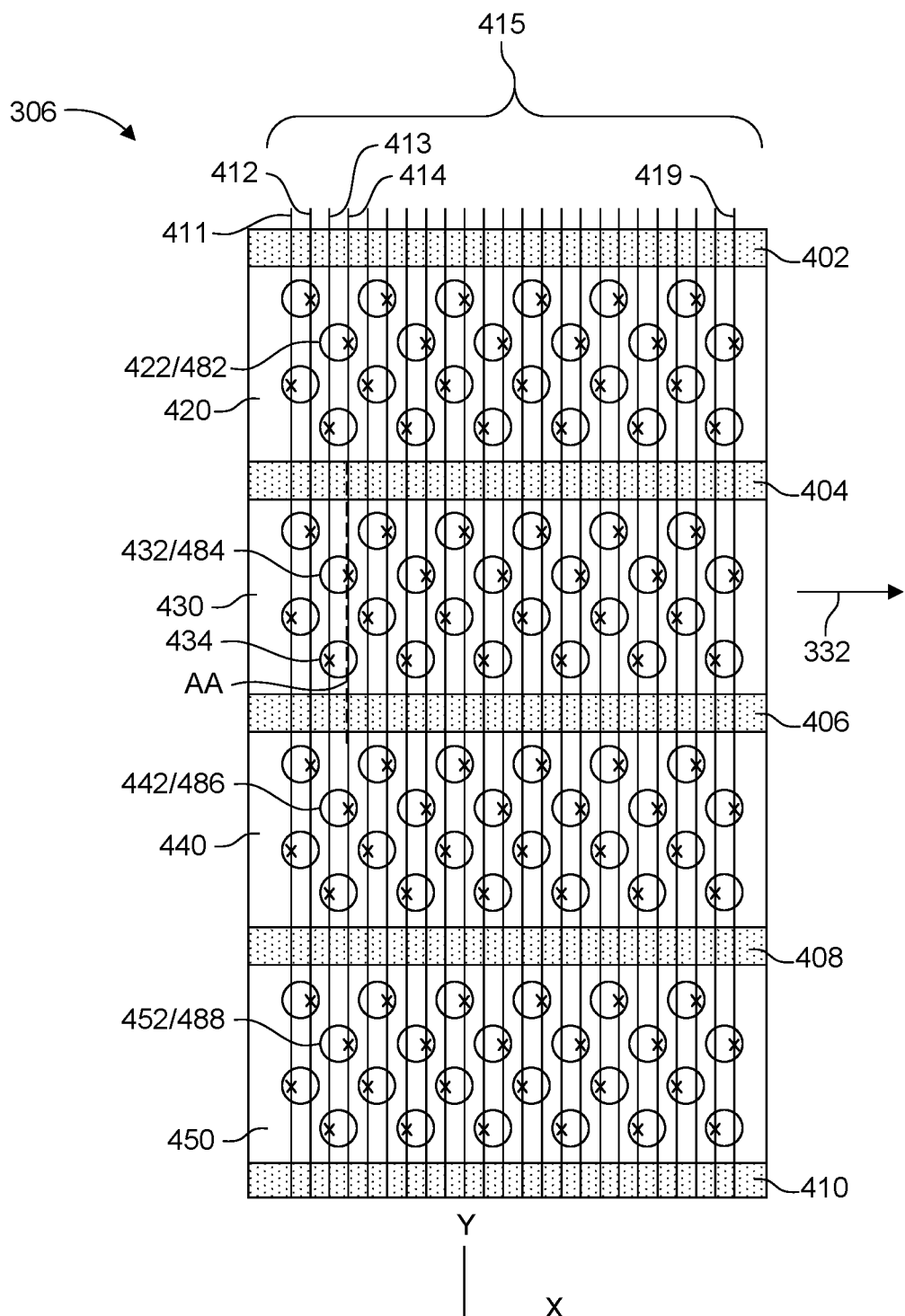
FIG. 4B depicts a top view of a portion of a block of example memory cells, in connection with which, example embodiments of the disclosed technology can be implemented.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of four rows connected to a common bitline are connected to the same wordline (via different wordline fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
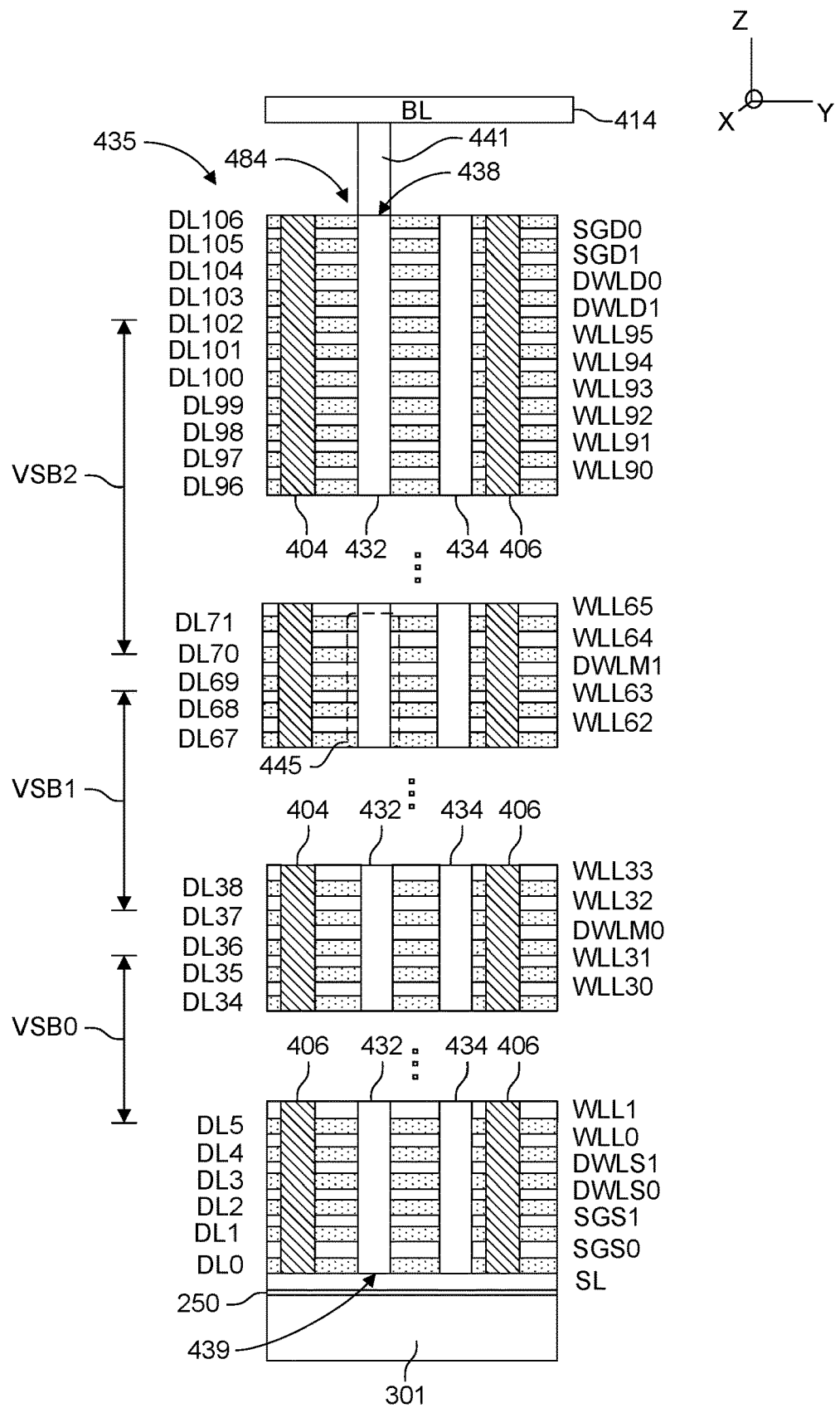
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SGD1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding with vertical sub-block VSB0 wordlines WLL0-WLL31) from a second set of memory cell transistors within the memory string (e.g., corresponding with the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy wordline layers DWLM in order to divide the stack 435 into the additional vertical sub-blocks. In one embodiment, the stack has two vertical sub-blocks.

Figure 4D:
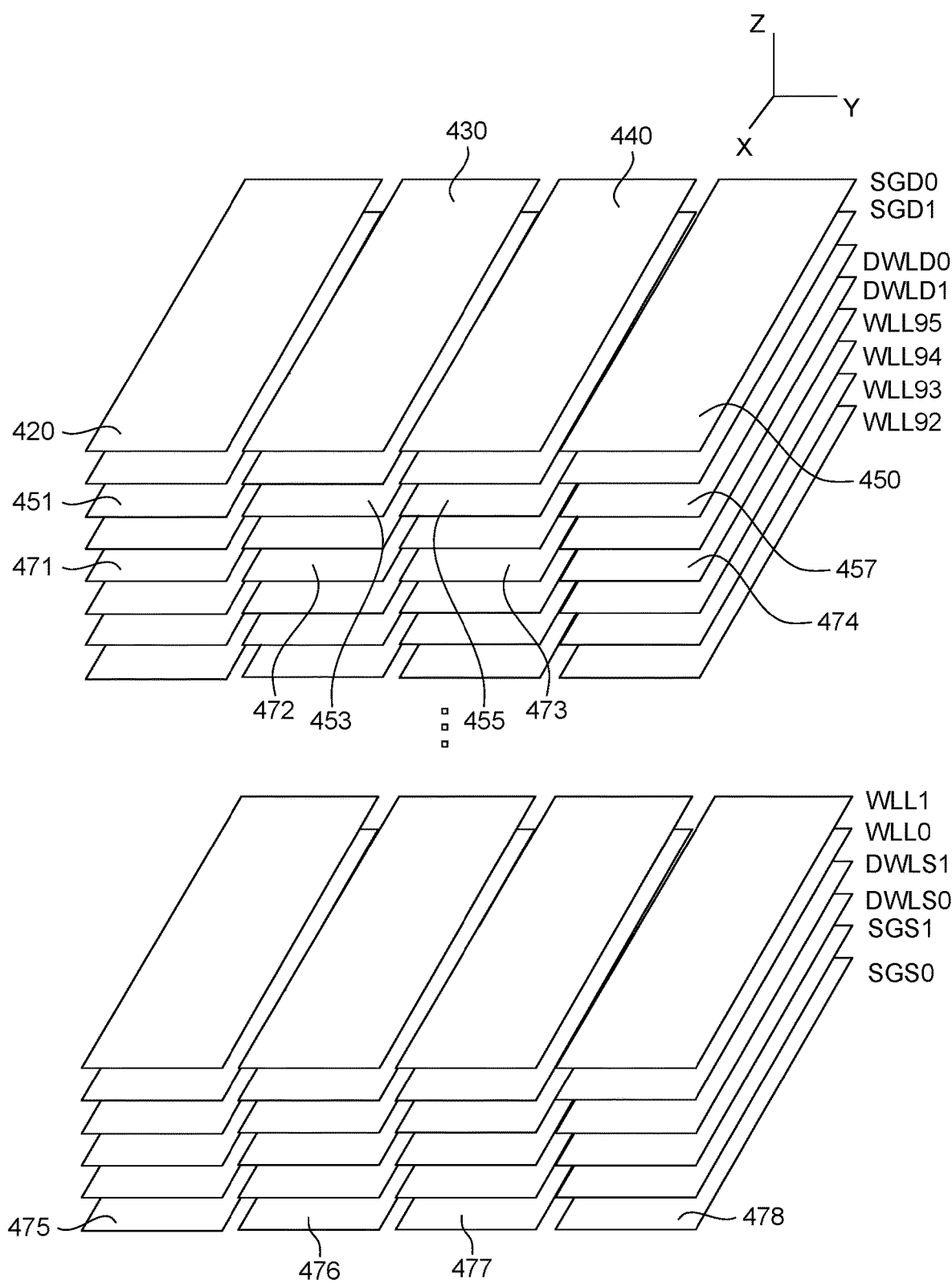
FIG. 4D depicts an alternative view of the select gate layers and wordline layers.

FIG. 4D depicts an alternative view of the SG layers and wordline layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy wordline layers. Each dummy wordline layer represents a wordline, in one approach, and is connected to a set of dummy memory cells at a given height in the stack. For example, DWLD0 comprises wordline layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source-side dummy wordline layers. Below the source-side dummy wordline layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
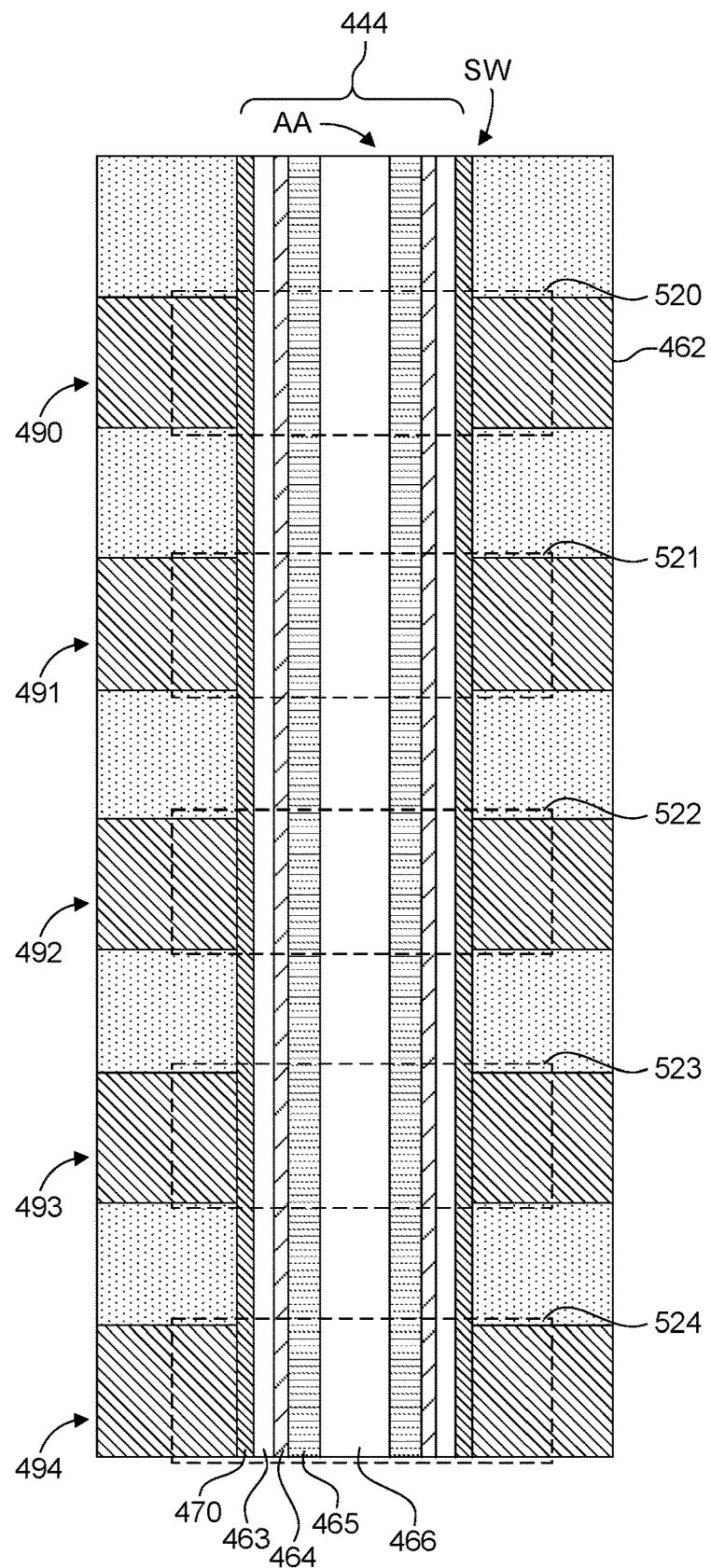
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel. For example, in one embodiment, the erase operation includes removing electrons from the floating gate in order to change the state of the cell to 1. During the erase operation, a large negative voltage is required to repel electrons from the floating gate. This can be accomplished by grounding the control gate and applying a high voltage (e.g., about 18V or more) to the substrate. As a result, electrons are removed from the floating gate due to the FN tunneling effect.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
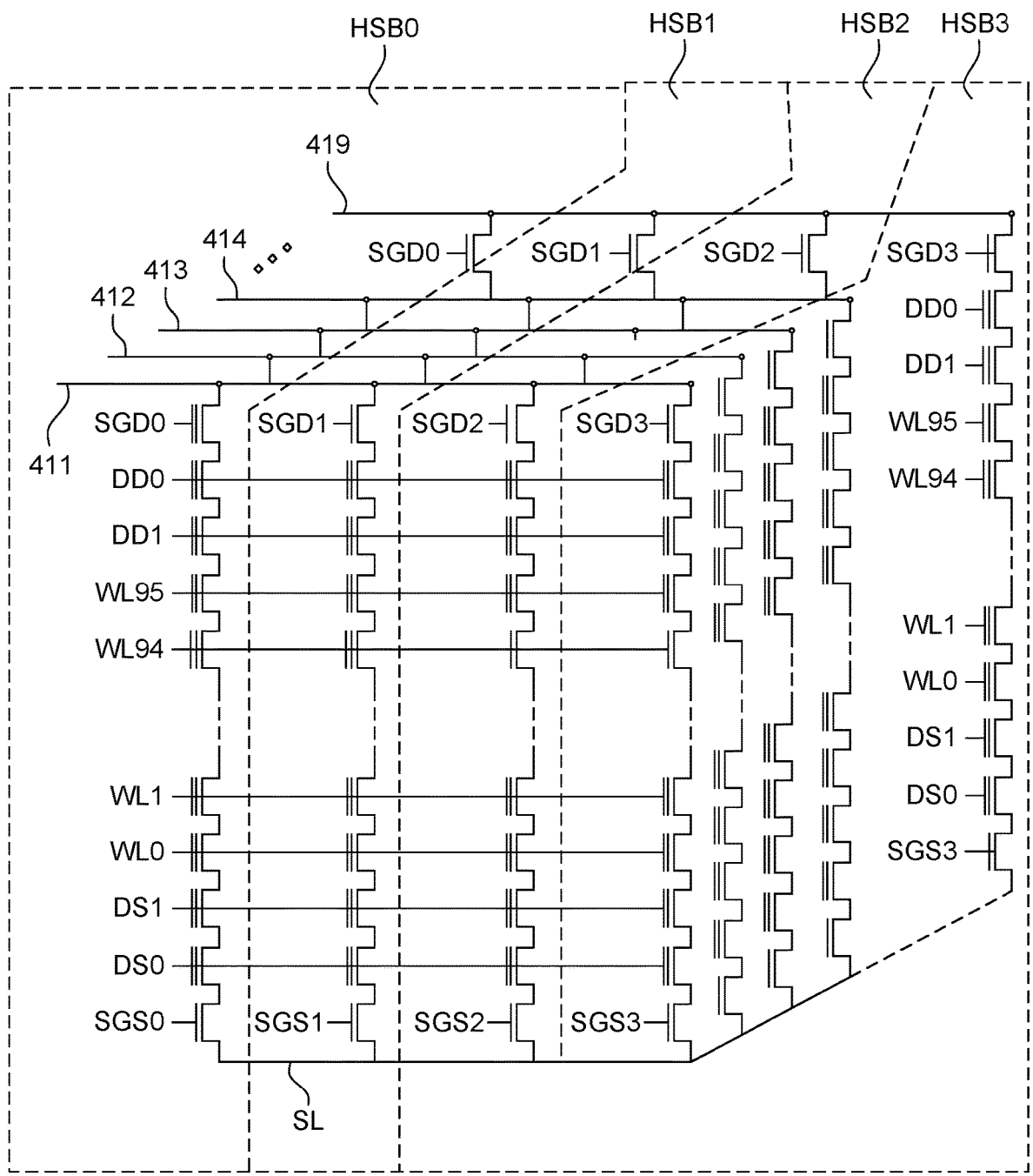
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, ... 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
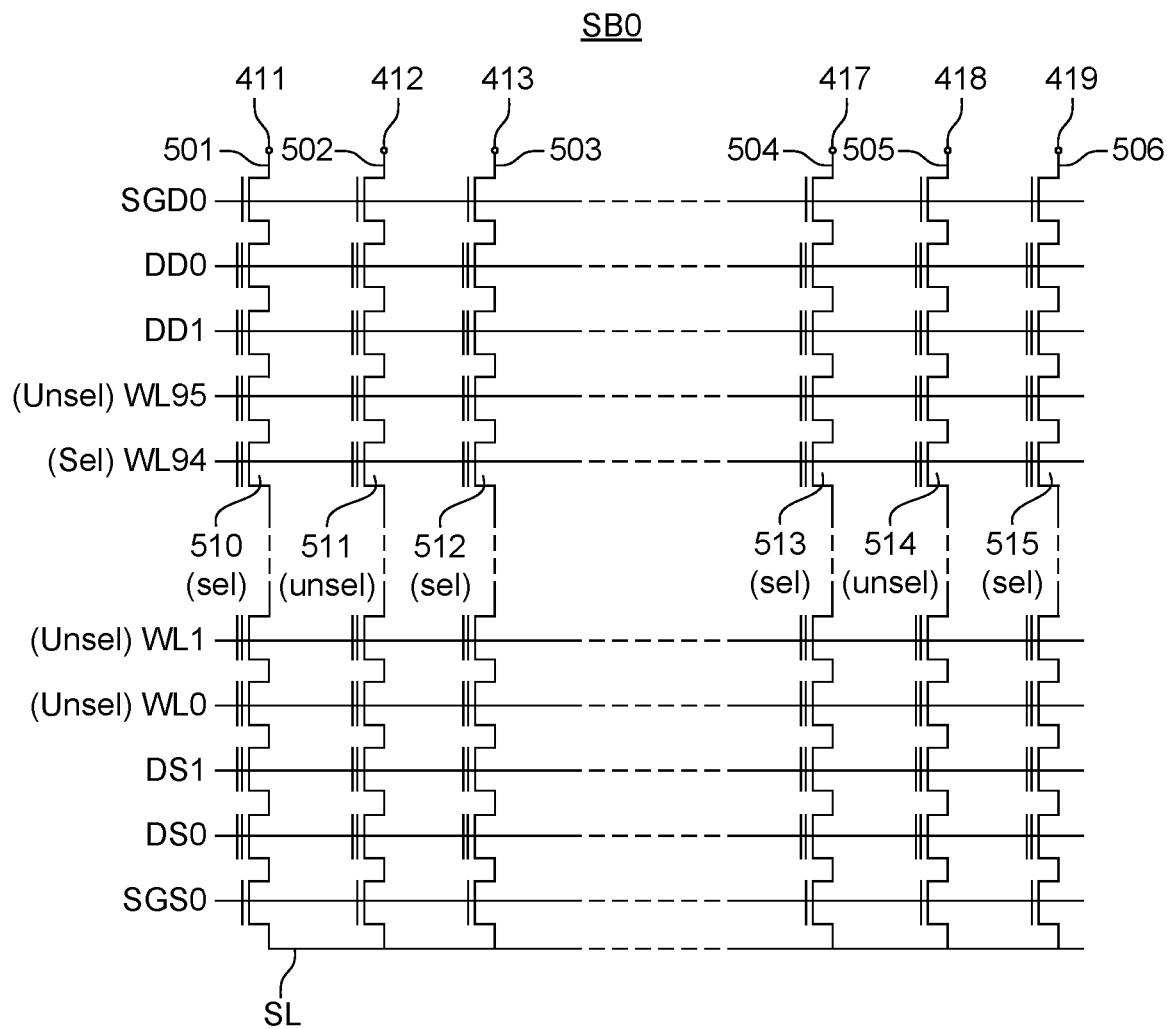
FIG. 4G is a schematic of horizontal sub-block HSB0.

FIG. 4G is a schematic of horizontal sub-block HSB0. Horizontal sub-blocks HSB1, HSB2 and HSB3 have similar structures. FIG. 4G shows physical wordlines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume for example purposes that memory cells 510, 512, 513 and 515 (which are connected to wordline WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figure 5:
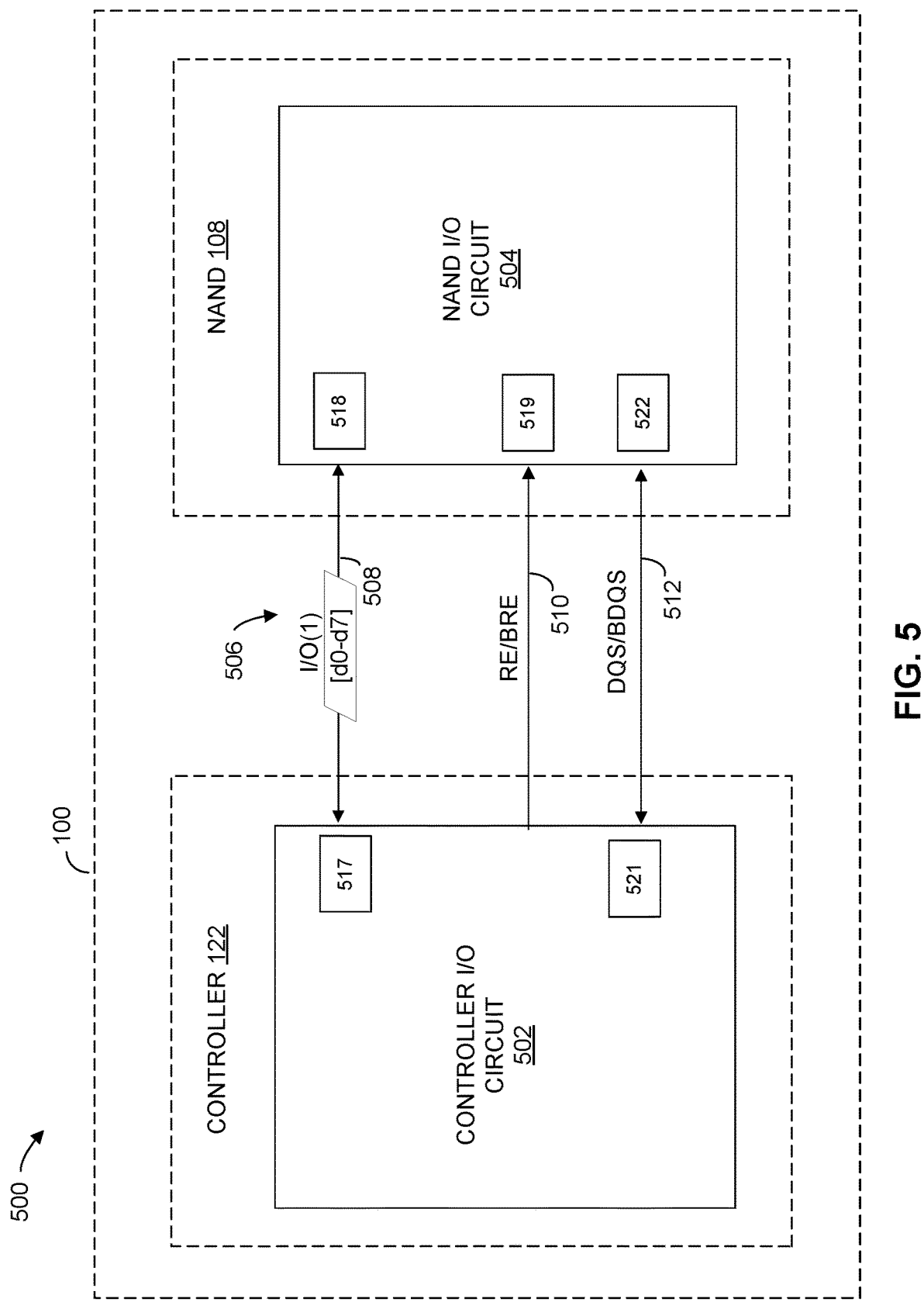
FIG. 5 shows one embodiment of an integrated circuit 500 in which the embodiments disclosed herein may be implemented.

FIG. 5 shows one embodiment of an integrated circuit 500 in which the embodiments disclosed herein may be implemented. The integrated circuit 500 may include the controller 122 and the memory die 108 comprising the NAND memory array as described in connection with FIGS. 1-4G.

The controller 122 includes an I/O circuit 502. The memory die 108 includes an I/O circuit 504. I/O circuit 502 and I/O circuit 504 are communicatively connected to each other via a plurality of communication buses 506. As seen in FIG. 5, I/O circuits 502, and 504 are integrated circuits configured to transmit and receive a plurality of signals over the plurality of communication buses 506. The plurality of signals include a clock (CLK) signal for latching data signals to the NAND memory die, an 8-bit bidirectional I/O data signal for transferring data (e.g., bits 0-7) to and from the NAND memory die 108, and a read enable RE output signal for indicating the start/stop of a read operation. In some interfaces (e.g., the ONFI NAND v2.x Interface (i.e., NV-DDR)) the I/O data signal is referred to as a DQ data signal transmitted along a DQ bus. For the purposes of the disclosure herein the DQ data signal and DQ bus are referred to as the I/O data signal and I/O bus.

Figure 6:
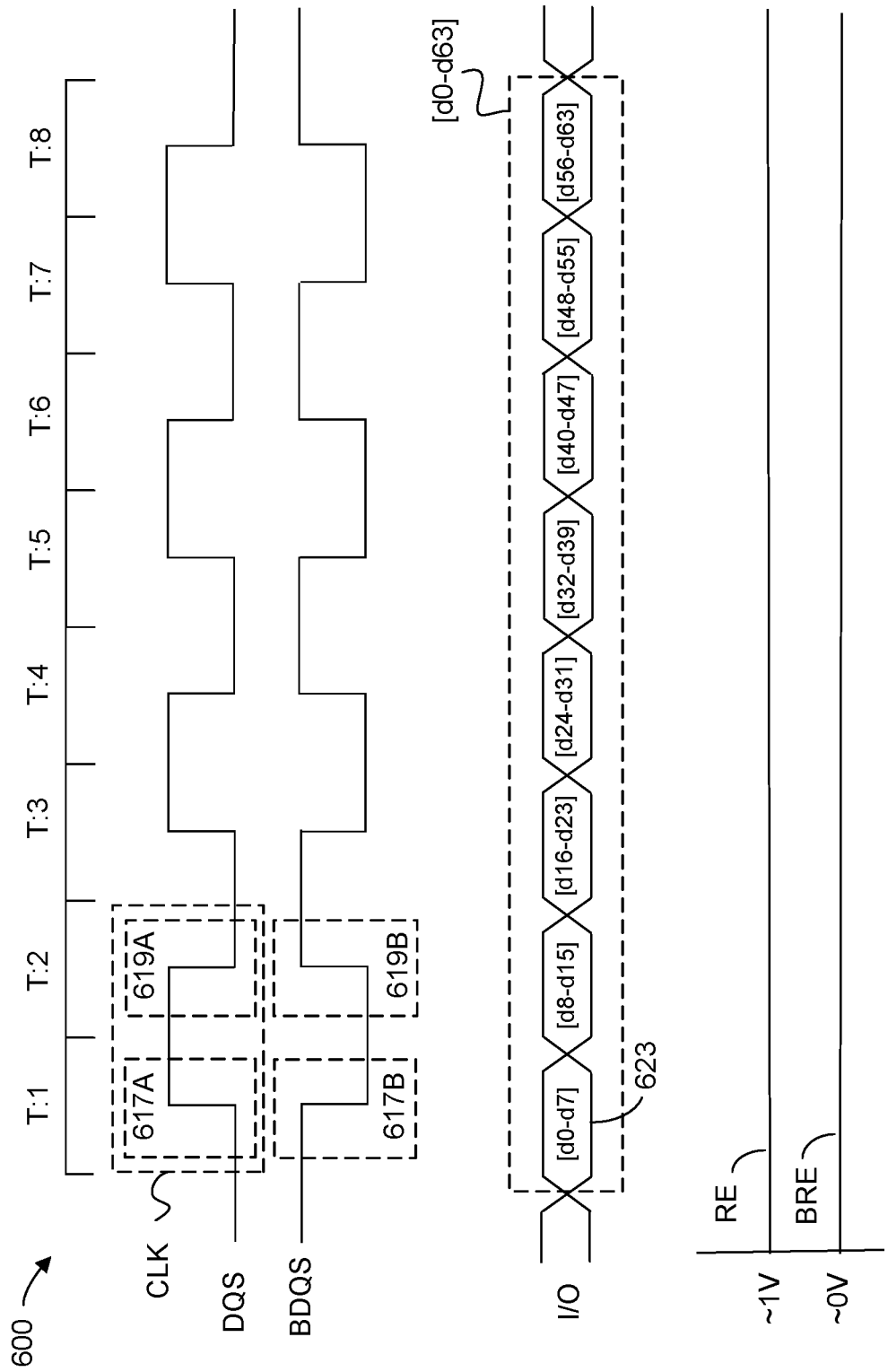
FIG. 6 is an example illustration of a plurality of signals passed through a NAND interface, according to one embodiment.

As described in further detail below, the CLK signal includes a pair of complementary CLK signals DQS (i.e., data strobe signal) and DQSB (i.e., inverse data strobe signal). The DQSB CLK signal is the logical inverse of the DQS CLK signal. The DQSB CLK signal is added for redundancy since rising and falling edges of one signal may be distorted during transmission. I/O data is transferred on both the rising and falling edges of the DQS/DQSB CLK signal to achieve a double data rate. For example, as seen in FIG. 6, during conventional programming I/O data is transferred on both the rising edge of the DQS/DQSB CLK signal and on the falling edge of the DQS/DQSB CLK signal. In some interfaces (e.g., the ONFI NAND v2.x Interface (i.e., NV-DDR)), the DQS CLK signal can be a bidirectional CLK signal (i.e., bidirectional DQS signal) that can be driven by the host 140 for write operations to the Flash and driven by the NAND (i.e., memory structure 126) while reading from the NAND memory array.

During a conventional write operation, NAND's write clock is the DQS/BDQS CLK signal. For example during a conventional write operation, the controller 122 is configured to send DQS/DQSB CLK signals and I/O data signals as outputs from the I/O circuit 502 to the I/O circuit 504 of the Memory die 108 via DQS bus 512 and I/O bus 508. The I/O circuit 504 is configured to receive the DQS/DQSB CLK signals and I/O data signals as inputs from the I/O circuit 502 via DQS bus 512 and I/O bus 508.

During a typical read operation, NAND's read clock is RE/BRE. For example, during a conventional read operation, the controller 122 is configured to send RE/BRE CLK signals from I/O circuit 502 to I/O circuit 504 on the memory die 108. After the I/O circuit 504 receives the RE/BRE CLK signals, the I/O circuit 504 is configured to send DQS/DQSB CLK signals as outputs to the I/O circuit 502 via DQS bus 512 and I/O bus 508.

The I/O circuit 504 and I/O circuit 502 can have one or more clock input contacts 517-519 and 521-522 electrically connected with one or more respective clock lines (i.e., data transfer line). The clock input contact(s) comprise pins, pads, etc. In one embodiment, the I/O circuit 502 and the I/O circuit 504 form a source synchronous system. The source synchronous system is a system in which a source circuit sends a data signal along with a clock signal to a destination circuit in order for the destination circuit to use the clock signal to identify the data values of the data signal. In an alternative embodiment, the I/O circuit 502 and the I/O circuit 504 operate as transceiver circuits. As transceiver circuits, the I/O circuit 502 and the I/O circuit 504 may change roles. For example, in certain operations, circuit 504 sends a clock signal and a data signal to circuit 502, and circuit 502 uses the clock signal to identify the data values of the data signal. For such operations, the circuit 504 becomes the sending or the source circuit, and the circuit 502 becomes the receiving or the destination circuit.

During the proposed write operation, a RE/BRE CLK signal is sent from the controller 122 to the memory die 108 (e.g., NAND) via the RE bus. The I/O circuit 504 of the memory die 108 is configured to receive the BRE/RE CLK signal sent from the I/O circuit 502 of the controller 122 via the RE bus. By transmitting a CLK signal along the RE bus, the write operation can transmit one additional bit of data as a DQS data signal, and one additional bit of data as a BDQS data signal along the DQS bus in place of a CLK signal.

During the proposed read operation, the controller 122 is configured to transmit a RE/BRE CLK signal to the memory die 108 (e.g., NAND) via the RE bus. For example, the controller 122 is configured to output a RE/BRE CLK signal via the I/O circuit 502 and the memory die 108 is configured to receive the RE/BRE CLK signal via the I/O circuit 504. After receiving the RE/BRE clock signal at the I/O circuit 504 of the memory die 108, the I/O circuit 504 is configured to send data signals along the I/O bus and DQS bus to the I/O circuit 502 of the controller 122. For example, in one embodiment, the NAND is configured to send 8 bits of data along the I/O bus, and two bits of data along the DQS bus. In one embodiment, the NAND will send I/O data signals (i.e., I/O data signals 0-7), a DQS data signal (i.e., one additional data signal) and a BDQS data signal (i.e., one additional data signal) based on a number of RE/BRE clock signal edges received that the I/O circuit 504.

FIG. 6 is an example schematic of a plurality of signals, according to one embodiment. In general, a signal (e.g., DQS/BDQS CLK signals, data signals, and RE/BRE CLK signals) may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

For example, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MAX}$ may be predetermined levels or values, and in particular example configurations, predetermined levels or values specified as part of a swing requirement with which the source circuit 502 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level. A portion of a magnitude waveform of a signal over a transition is referred to as an edge. A portion of the magnitude waveform over a rising transition is a rising edge and a portion of the magnitude waveform over a falling transition is a falling edge.

The CLK signal, such as the input clock signal (e.g., DQS/BDQS), is a signal that has repetitive cycles occurring over successive periods T. The cycle includes portions of the signal a high level and at a low level. Accordingly, the portions may be defined by consecutive rising and falling transitions or edges of the clock signal. A rising edge or falling edge defines a boundary when one portion ends and a next portion, either of the same cycle or of a next cycle, begins. Thus, the clock pulses which comprise the clock signal are defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Figure 7:
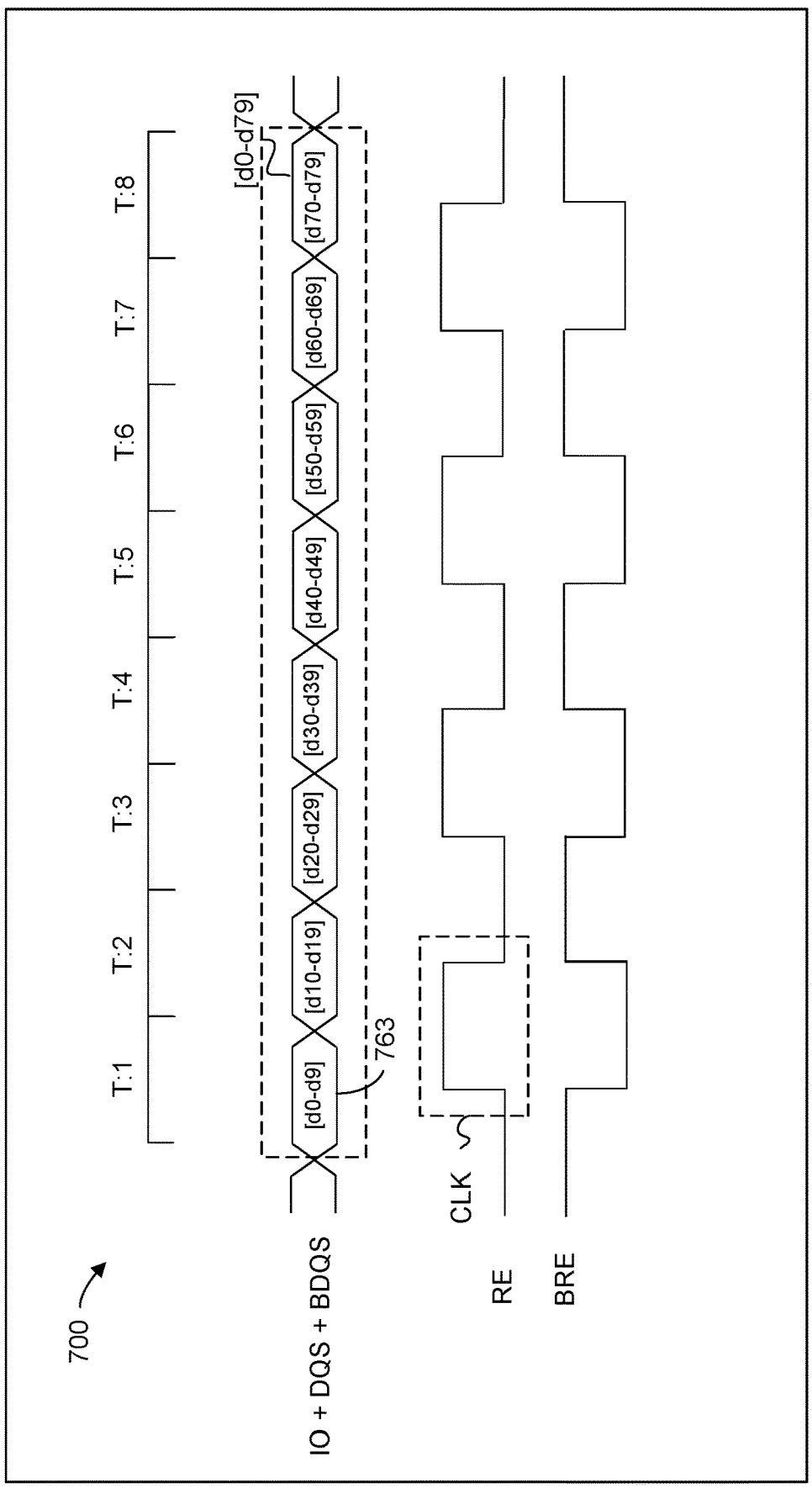
FIG. 7 is an example illustration of a plurality of signals passed through a NAND interface, according to one embodiment.

The data signal (e.g., I/O data signal) is a signal that carries and/or includes data. As seen in FIG. 6, the I/O data signal, includes a plurality of eyes 623. Each eye represents a bit of data (e.g., bits [0:7]) The eye is made up from even and odd pulses of a data signal. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents. Here, the plurality of data eyes include 64 bits of data (i.e., [d0-d63]). As seen in FIG. 7, the plurality of data eyes include 80 bits of data (i.e., [d0-d79]).

Most NAND interface configurations (e.g., a DDR interface in Toggle Mode NAND), include a bi-directional DQS/BDQS CLK signal to control data interface timing. During a write operation (i.e., when the host is sending I/O data to the NAND), the DQS/BDQS signal is driven by the host. During a read operation (i.e., when the NAND is sending I/O data to the host), the DQS/BDQS signal is driven by the NAND. Each rising and falling edge of the DQS/BDQS signal is associated with data transfer. As seen in FIG. 6, the DQS/BDQS clock signal includes two signals per clock cycle. Data can be triggered on both the rising edge and falling edge of the DQS/BDQS clock signal. For example, a clock frequency of 200 MT/s data can be transmitted twice at 100 MHz.

As seen in FIG. 6, the DQS CLK signal includes a rising edge 617A, and the BDQS CLK signal includes a falling edge 619B (i.e., a complimentary signal to the DQS signal). Data signals can be transferred along the DQS bus on either the rising or falling edge of a DC signal. Thus, the DQS/

BDQS CLK signal can be used to send a data signal in place of the CLK signal. For example, at a first time (T:1), one bit (i.e., a first bit) of data can be transferred from the I/O circuit to the I/O circuit 504 on the rising edge of a DQS data signal passed along the DQS bus, while another bit (i.e., a second bit) of data can be transferred from the I/O circuit 502 to the I/O circuit 504 on the falling edge 617B of a BDQS data signal passed along the DQS bus. In one embodiment, the BDQS data signal can be passed along a BDQS bus, and a BRE CLK signal can be passed along a BRE bus. In some embodiments, a DQS/BDQS data signal can be passed along a DQS/BDQS bus, and a RE/BRE CLK signal can be passed along a RE/BRE bus. For example, in one embodiment the DQS data signal and BDQS data signal is passed along the same bus, and the RE CLK signal and BRE CLK signal is passed along the same bus.

The same data transfer can occur at times T:2-T:8. For example, at a second time (T:2), one bit (i.e., a first bit) of data can be transferred from the I/O circuit 502 to the I/O circuit 504 on a falling edge 619A of a DQS data signal, while another bit (i.e., a second bit) of data can be transferred from the I/O circuit 502 to the I/O circuit 504 on a rising edge 619B of a BDQS data signal.

During a conventional write operation, the read enable RE voltage level is low. Conventional write operations use DQS and BDQS CLK signals to latch data. Any RE/BRE CLK signals on RE bus are maintained at a stable state. However, because the RE bus is used to send a RE CLK signal from the controller during a read operation, the RE bus can be used to pass a CLK signal to the NAND, in place of the DQS bus, during a write operation.

FIG. 7 is an example illustration of a plurality of signals transmitted from the I/O circuit 502 to the I/O circuit 504 during a write operation, and vice versa during a read operation, according to one embodiment. Here, the plurality of signals include a plurality of data signals and CLK signals transmitted over time periods T:1-T:8. FIG. 7 further includes a plurality of 10-bit data eyes each representing one set of 8-bit I/O data signals, 1-bit DQS data signal, and 1-bit BDQS data signal. By using the DQS/BDQS CLK signals as a data signal, the I/O circuit 502 can send an additional 2 bits per clock cycle. However, since the DQS bus is no longer used to transmit a CLK signal, to properly latch the I/O and DQS/BDQS data signals, an additional CLK signal must be used. Because the RE bus is used to send RE/BRE clock signals during a read operation, during a write operation, a CLK signal can be transmitted along the RE bus to latch the I/O and DQS/BDQS data signals.

The RE CLK signal includes a pair of complementary CLK signals RE and BRE transmitted between the I/O circuit 502 and the I/O circuit 504, along the RE bus. The BRE CLK signal is the logical inverse of the RE CLK signal. Both the BRE CLK signal and RE CLK signal are transmitted along the RE communications bus 510. The I/O circuits 502, and 504 are configured to send and receive the complimentary BRE/RE CLK signals simultaneously and/or in parallel. During the proposed read operation, the RE/BRE CLK signal is sent from the controller 122 to the memory die 108. The memory die 108 sends data signals to the controller 122 via the I/O bus and the DQS bus once the memory die 108 receives the RE/BRE CLK signal. For example, once I/O circuit 504 receives a RE/BRE CLK signal, it sends a plurality of data signals to I/O circuit 502 via the I/O bus and DQS bus. In one embodiment, the memory die 108 sends data signals to the controller 122 after a short delay after receiving the RE/BRE CLK signal. During the proposed write operation, the controller 122 sends data signals to the memory die 108, comprising the memory structure 126, via I/O bus and DQS bus. For example, during a write operation, the I/O circuit 502 second a plurality of data signals via the I/O bus and DQS bus to the I/O circuit 504 on the memory die 108.

Figure 8:
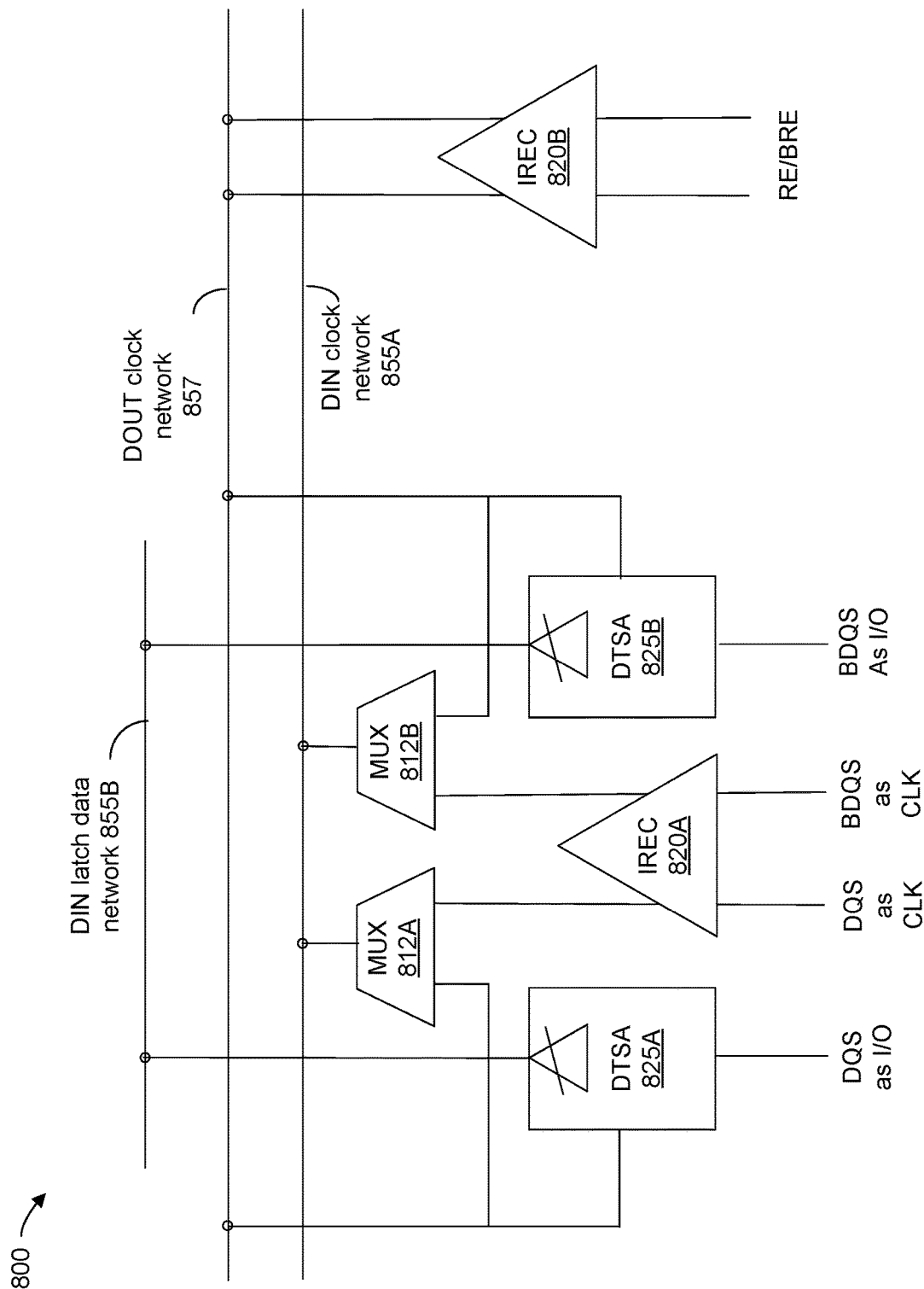
FIG. 8 is an example schematic of a DIN operation, according to one embodiment.

FIG. 8 is an example schematic of a write operation, according to one embodiment. The example schematic includes a circuit 800 comprising a plurality of circuit elements communicatively coupled to a plurality of network buses. The plurality of circuit elements include: a first input latch 825A, and a second input latch 825B; a first input receiver (IREC) 820A and a second IREC 820B; a first multiplexer (MUX) 812A, and a second MUX 812B. In one embodiment, the first input latch includes a first dual tail sense amplifier (DTSA), and the second input latch includes a second DTSA. Here, each DTSA 825A, 825B is used as a flip flop to receive an analog input to latch I/O data. The plurality of network buses include input and output buses. As seen in FIG. 8, the simplified block diagram 800 includes a DIN clock network bus 855A, a DOUT clock network bus 857, and a DIN latch data network 855B. The DIN clock network bus 855A is an on chip clock network bus (e.g., a DSIN network bus) configured to receive latched DQS/BDQS data signals from the DQS/BDQS bus. The DIN latch data network bus 855B (e.g., YWD network bus) is a network bus that can be used after data is latched. Each DIN and DOUT network bus is electrically coupled a circuit element. For example DIN latch data network bus 855B is electrically connected to DTSA 825A and DTSA 825B. DTSA 825A and DTSA 825B are each configured to latch data onto the YWD network bus. The I/O bus is located external from the NAND, while the DIN latch data network 855B is a data network disposed on-chip. The DOUT clock network bus 857 (e.g., a REOLAT network bus) is electrically connected to one or more I/O buses (not shown). The DOUT clock network bus is used to provide CLK signals to transmit internal data (e.g., transmit internal data network) onto the I/O bus during a write operation. The CLK network is used for CLK signal distribution (i.e., DQS/BDQS CLK signal during normal operation, and RE/BRE CLK signal during the proposed operation). The CLK signal is transmitted to each DTSA during a write operation. In one embodiment, the CLK network is not connected to the data network (e.g., the CLK network is only controlling how data network flows).

The I/O signal is passed through the DTSA 825A and DTSA 825B to latch data onto the DIN latch data network bus 855B if DQS/BDQS are operating as data signals. For example, a DQS data signal is passed into DTSA 825A to latch at least one bit onto the DIN latch data network bus 855B and a BDQS data signal is passed through DTSA 825B to latch at least one bit onto the DIN latch data network bus 855B. If the DQS bus is operating as a conventional CLK signal, then the DQS/BDQS clock signal CLK is latched by the IREC 820A and sent to the DIN clock network 855A via MUX 812A and MUX 812B. Each MUX 812A, 812B is configured to switch between a DQS/BDQS CLK signal during normal operation, and a RE/BRE CLK signal during the proposed write operation. For example, in one embodiment, MUX 812A is configured to switch between the DQS CLK signal during the normal write operation, and the RE CLK signal during the proposed write operation, and MUX 812B is configured to switch the BDQS CLK signal during the normal write operation, and the BRE CLK signal during the proposed write operation. During a conventional write operation, the RE/BRE CLK signal will be gated by MUX 812A, MUX812B. Thus, the RE/BRE CLK signal will not be transmitted onto the DIN network.

Furthermore, during a conventional write operation a DQS/BDQS CLK signal will be transmitted through MUX 812A, MUX812B from IREC 820A. During the increased NAND I/O bandwidth operation described herein, the RE/BRE CLK signal is used as a write CLK signal, and is passed through MUX 812A, MUX812B from IREC 820B. Conventional data transfer along the I/O bus requires a DQS/BDQS CLK signal transmitted along the DQS bus to latch the I/O data signals. Thus the circuit in the example block diagram provides a method by which conventional data transfer via the I/O bus and DQS/BDQS signal can be used in conjunction with the proposed data transfer method. If a user/host desires additional data signal transfer, the proposed method can be used to implement a RE/BRE clock signal, and transfer additional DQS/BDQS data signals in place of the RE/BRE clock signal. Thus, the circuit 800 allows for the DQS bus to transmit a CLK signal (e.g., DQS/BDQS CLK signal) or a data signal (e.g., DQS/BDQS data signal) depending on the desired implementation (i.e., conventional data transfer or increased NAND I/O bandwidth).

Figure 9:
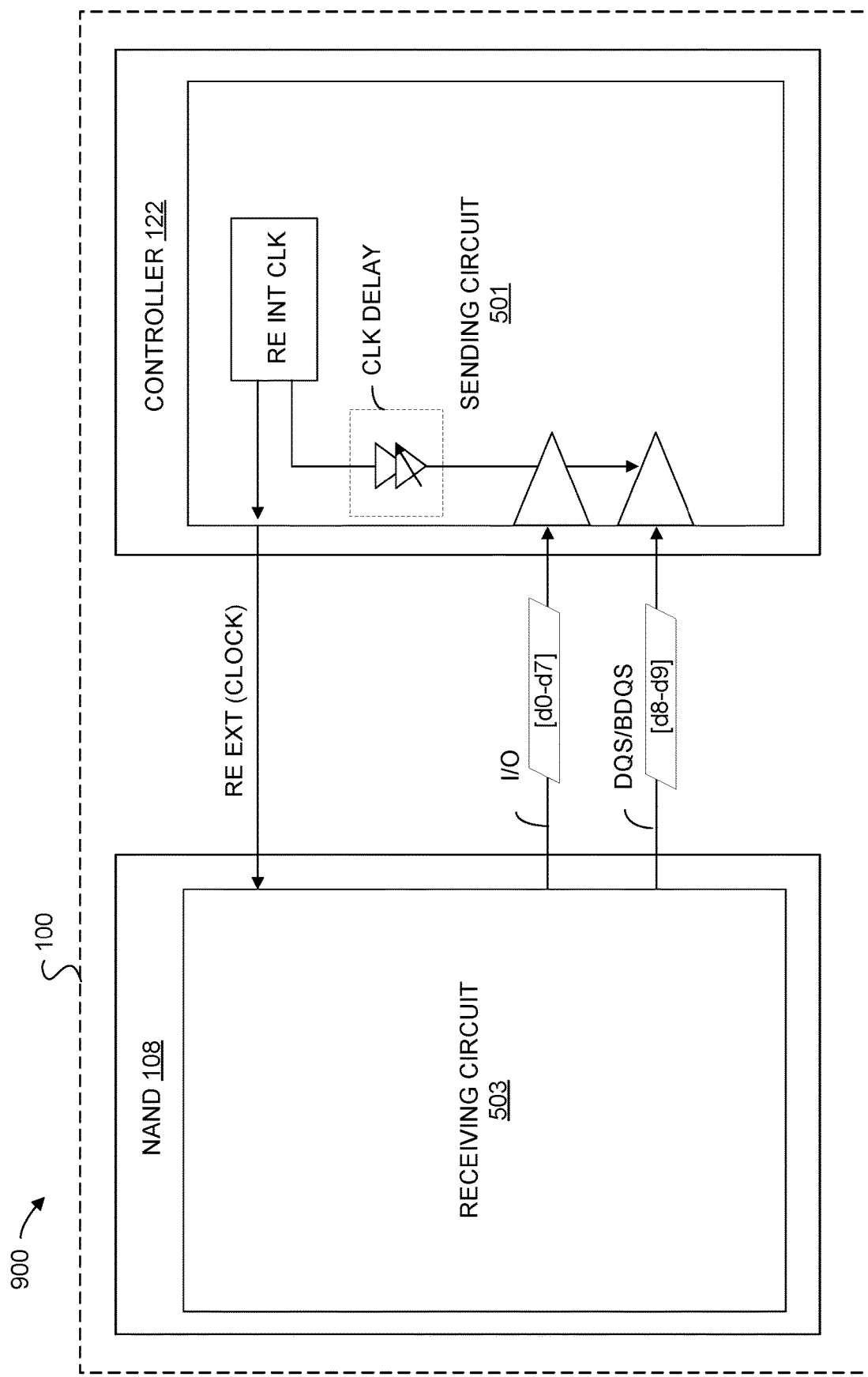
FIG. 9 is an example schematic of a DOUT operation, according to one embodiment.

FIG. 9 is an example schematic of a read operation, according to one embodiment. The read operation transmits data along an I/O bus from the I/O circuit 504 of the memory die 108 to the I/O circuit 504 of controller 122. In a typical DOUT operation, an RE/BRE CLK signal is sent from the I/O circuit 504 of the controller 122 to the I/O circuit 502 of the memory die 108 via the RE bus. Once the I/O circuit 504 receives the RE/BRE CLK signal, the memory die 108 sends data signals from the I/O circuit 504 to the I/O circuit 502 of the controller 122 via the I/O and DQS bus. Data signals are latched to the controller 122 on the rising and falling edge of the RE/BRE clock signal. During conventional read operations, to properly read data, the controller includes a DQS/BDQS CLK signal. However, because the proposed method uses the DQS bus to transmit a data signal (i.e., one bit is transmitted as a DQS data signal, and one bit is transmitted as a BDQS data signal), an internal clock RE INT CLK (i.e., an internal controller clock) is required to allow a controller 122 to read data (i.e., latch data) out of the NAND, during a DOUT operation. For example, in one embodiment, the I/O circuit 502 of the controller 122 includes an internal clock (i.e., RE INT CLK) that generates an internal CLK signal to latch data signals during the read operation. As seen in FIG. 9, the RE INT CLK is in electrical communication with both the DQS bus and the I/O bus. The RE INT CLK signal allows one additional bit to be transmitted from the memory die 108 (e.g., NAND) to the controller 122 along the DQS bus as a DQS data signal, and one additional bit to be transmitted from the NAND to the controller along the DQS bus as a BDQS data signal.

Furthermore, to properly transfer data during a read operation, the RE internal CLK need to adjusted (i.e., calibrated). For example, in one embodiment, the controller conducts a read calibration operation to align the RE INT CLK signal with the I/O data signal, and the DQS/BDQS data signal. The read calibration depends on process conditions that include controller and NAND environment voltages, and temperatures. In one embodiment, the read calibration operation includes delaying the RE INT CLK signal by one cycle to align the RE INT CLK signal with the I/O and DQS/BDQS data signals. One method of delaying the CLK signal is to use one dummy CLK cycle. After one dummy CLK cycle, data signals can be latched onto the I/O and BDQS buses.

Figure 10:
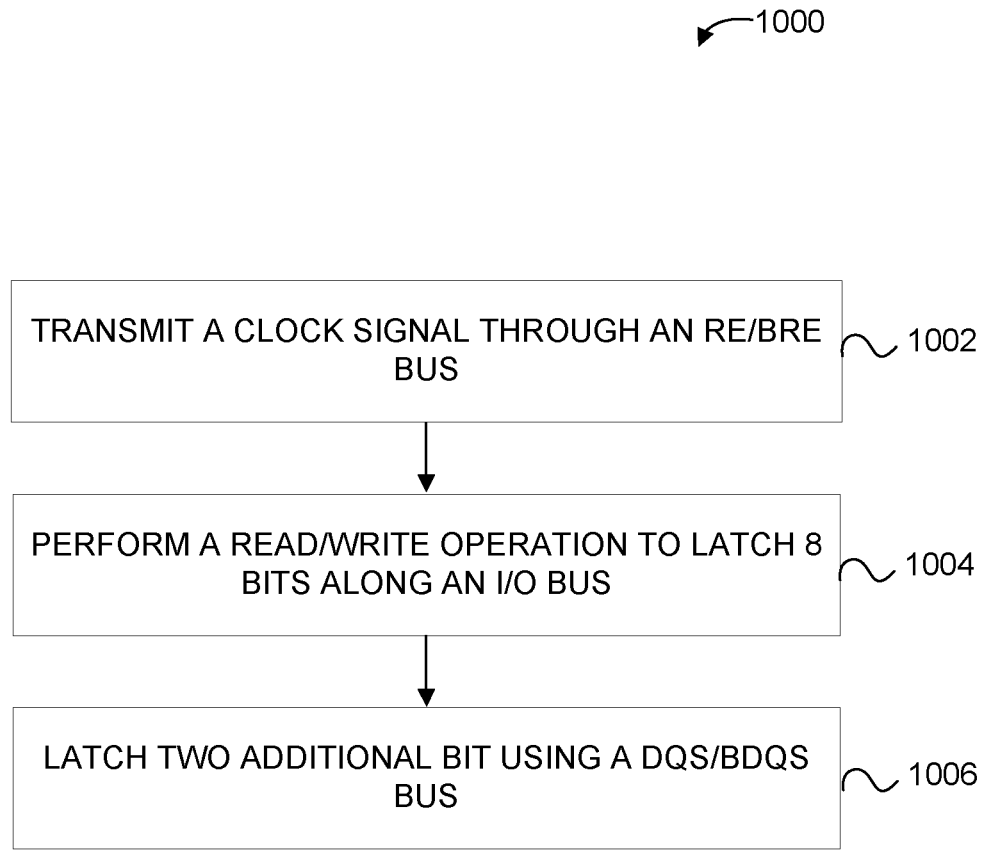
FIG. 10 is an example method of increasing I/O bandwidth, according to one embodiment.

FIG. 10 is a method of increasing I/O bandwidth. The method 1000 includes transmitting a CLK signal via an RE bus, performing a read/write operation using an I/O bus to latch 8 bits, and two additional bits using a DQS bus. In conventional write operations, any RE/BRE signals on RE bus are maintained at a stable state, and DQS and BDQS signals are used as CLK signals to latch I/O data onto the NAND. By transmitting CLK signals along the RE bus, the write operation can transmit one additional bit of data as a DQS signal, and one additional bit of data as a BDQS data signal along the DQS bus in place of the CLK signals. Thus, two additional data signals can be written (i.e., transmitted) into the memory die 108 (e.g., the memory structure comprising the NAND memory). For example, unlike conventional I/O data transfer where 8 bits of data can be latched, the proposed method allows for two additional bits of data to be latched to the DQS bus (e.g., one bit of data as a DQS data signal and one bit of data as a BDQS data signal). During a read operation, the RE bus can be used to pass a CLK signal to the NAND, in place of the DQS bus. Thus allowing the user device to read, two additional I/O data signals (e.g., 10 bits).

At activity 1002, the method 1000 includes transmitting a CLK signal along an unused RE bus. As shown in FIG. 6, during conventional read/write operations, a CLK signal is transmitted along the DQS bus. Because RE/BRE signals are maintained at a stable state during a write operation, the RE bus can be used to transmit a CLK signal. By transmitting a CLK signal along the RE bus (as shown in FIG. 7), one additional bit can be latched as a DQS data signal and one additional bit can be latched as a BDQS data signal along the DQS.

At activity 1004, the method 1000 includes performing a read/write operation using the I/O bus to latch 8 bits. During typical read/write operations, 8-bits of I/O data are latched on each edge of CLK signal. Since clock signals typically include DC square waves comprising rising edges and falling edges, 8-bits of data can be latched on each rising and falling edge. For example, given 4 square wave CLK signal pulses (i.e., 4 clock cycles), 64 bits of I/O data can be latched along the I/O bus.

During the read operation, the controller 122 is configured to send a RE/BRE CLK signal to the memory die 108 via the RE bus. The memory die 108 is configured to receive the RE/BRE CLK signal send from the controller 122 via the RE bus. After receiving the RE/BRE clock signal at the receiving circuit, the memory die 108 will send I/O data along the I/O bus and the DQS bus from the memory die 108 to the controller 122. The memory die 108 will send the I/O data to the controller 122 based on the number of RE/BRE edges its receives from the controller. To properly transfer I/O data from the memory die 108 to the controller 122 along the I/O and DQS bus, the controller 122 includes an RE INT CLK signal. By using the RE INT CLK signal, the controller can read one additional bit of data as a DQS data signal, and one additional bit of data as a BDQS data signal along the DQS bus.

During a write operation, a RE/BRE CLK signal is sent from the memory die 108 to the controller 122 via the RE bus. The controller 122 is configured to receive the BRE/RE CLK signal sent from the memory die 108 via the RE bus. By transmitting a CLK signal along the RE bus, the write operation can transmit one additional bit of data as a DQS data signal, and one additional bit of data as a BDQS data signal along the DQS bus in place of a CLK signal.

At activity 1006, the method 1000 includes latching two additional bits using the DQS bus. As shown in FIG. 7, in addition to the 8-bits of data that are latched to the I/O bus during each edge of the RE/BRE clock, 2-bits of data can be latched on the DQS bus. Because the BDQS signal is the logical inverse signal to the DQS signal, latching each signal along the DQS bus will not result in noise. The two additional bits of data can latched simultaneously with the 8-bits of data at activity 1004. Thus, by using the RE/BRE CLK signal to latch 10-bits of data along the I/O and DQS bus, 10-bits of data can be read/written during a read/write operation.

In one embodiment, during a read operation, an RE internal CLK is used to latch data instead of a DQS/BDQS CLK signal. To properly transfer data during a read operation, the RE internal CLK must be adjusted (i.e., calibrated). Typical adjustments include delaying the CLK signal by one cycle to align the CLK signal with the I/O data signals and DQS/BDQS data signals. One method of delaying the CLK signal is to use one dummy CLK cycle. After one dummy CLK cycle, data signals can be latched onto the I/O and BDQS buses.

Figure 11:
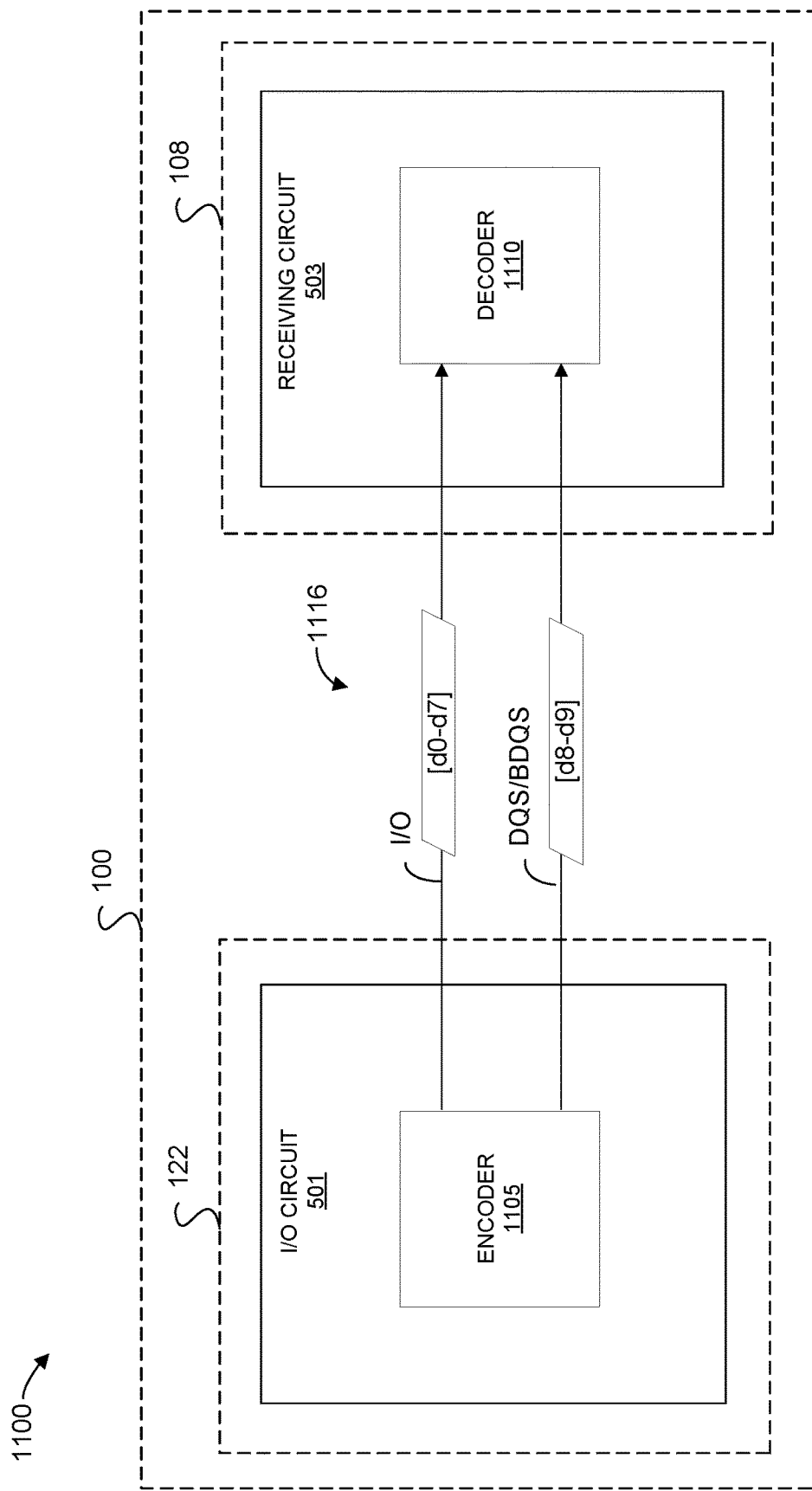
FIG. 11 is a simplified block diagram of a circuit for implementing one or more embodiments disclosed herein.

FIG. 11 is an example schematic of an encoding and decoding scheme 1100, according to one embodiment. FIG. 11 includes a controller 122 comprising a controller I/O circuit 502 comprising an encoder 1105, and a memory die 108 comprising a memory die I/O circuit 504 comprising a decoder 1110. In one embodiment, memory die I/O circuit 504 comprises the encode 1105 and the controller I/O circuit 502 comprises the decoder 110. In one embodiment, the encoder may be disposed in a user device, and communicatively connected to controller 122. The user device may transmit data to the controller 122 via wired, or wireless communication.

During conventional data transfer (i.e., read/write operations), I/O data signals pass solely over the I/O bus from the controller I/O circuit 502 to the memory die circuit 504 and vice versa. For example, during a conventional read operation data signals are sent from the memory die 108 to the controller 122, and during a conventional write operation data signals are sent from the controller 122 to the memory die 108. However, using the methods described herein, one or more additional data signals can be passed through the DQS bus.

Occasionally, during data signal processing, a lone pulse can result in a weak signal. During signal processing a string of low voltage signals can "weigh" down an isolated pulse. For example, a set of bits (e.g., a word, halfword, etc.) comprising a lone pulse can sometimes result in a weak pulse comprising a small pulse width (tDIPW) or a small pulse height. One method of preventing a weak pulse is to toggle an additional pulse before or after the lone pulse. Using the increased NAND I/O bandwidth method described herein, two additional data signals comprising two bits of data can be programmed as two additional pulses along with the 8 bit (e.g., [d0-d7]) set of bits (e.g., a halfword). For example, if 1 byte of original data includes the following 8 bits (e.g., [d0-d7]) having a lone binary value resulting in a lone pulse as seen in the following set of bits:

00001000 or 11110111

Because the DQS bus can be used to send an additional 2 bits as a DQS/BDQS data signals, a 10 bit encoding scheme can be used to prevent the weak signal. For example, to remove the lone pulse, two additional bits can be appended to the set of bits and sent to the receiver circuit via the I/O and DQS bus. In one embodiment, a 8 b/10 b SerDes encoding scheme is used to map 8 bit sets of data (i.e., halfwords) to 10 bit sets of data. The 10 bit set of data forms a 10 bit entity called a "symbol". By encoding 8 bits of data to 10 bit "symbols" the SerDes encoding scheme can achieve a DC balance and bounded disparity. Referring back to the previous example, if the 8 bit set of data comprises 7 bit having binary values of 0 (i.e., low values), and 1 bits having binary values of 1 (i.e., high values), grouped together, the low 7 bits of data can be encoded into a 8-bit group, and the 1 high bit of data can be encoded into a 2-bit group. The groups are concatenated together to form the 10 bit symbol. Although two additional bits are appended to the set of bits, the original set of bits can remain undisturbed. The data signal can be toggled before and after the original set of bits without altering the bits. Thus, the receiver can decode 10 b back to 8 b.

Furthermore, once the 10 bits of 8 b/10 b data are decoded by the memory die I/O circuit 504, the 8 bits will be sent to the memory structure 126 (e.g., NAND), thus preventing any impact to on chip data transfer. Because the I/O bus along with the DQS bus allows for 10 bits to be sent from the controller I/O circuit 502 to the memory die I/O circuit 504, and vice versa, during the 8 b/10 b encoding scheme, adding two additional bits to an original set of 8 bits will not negatively affect the bandwidth. Thus, the I/O data transfer speeds could be increased to a higher speed with less impact to the data transfer.

Figure 12:
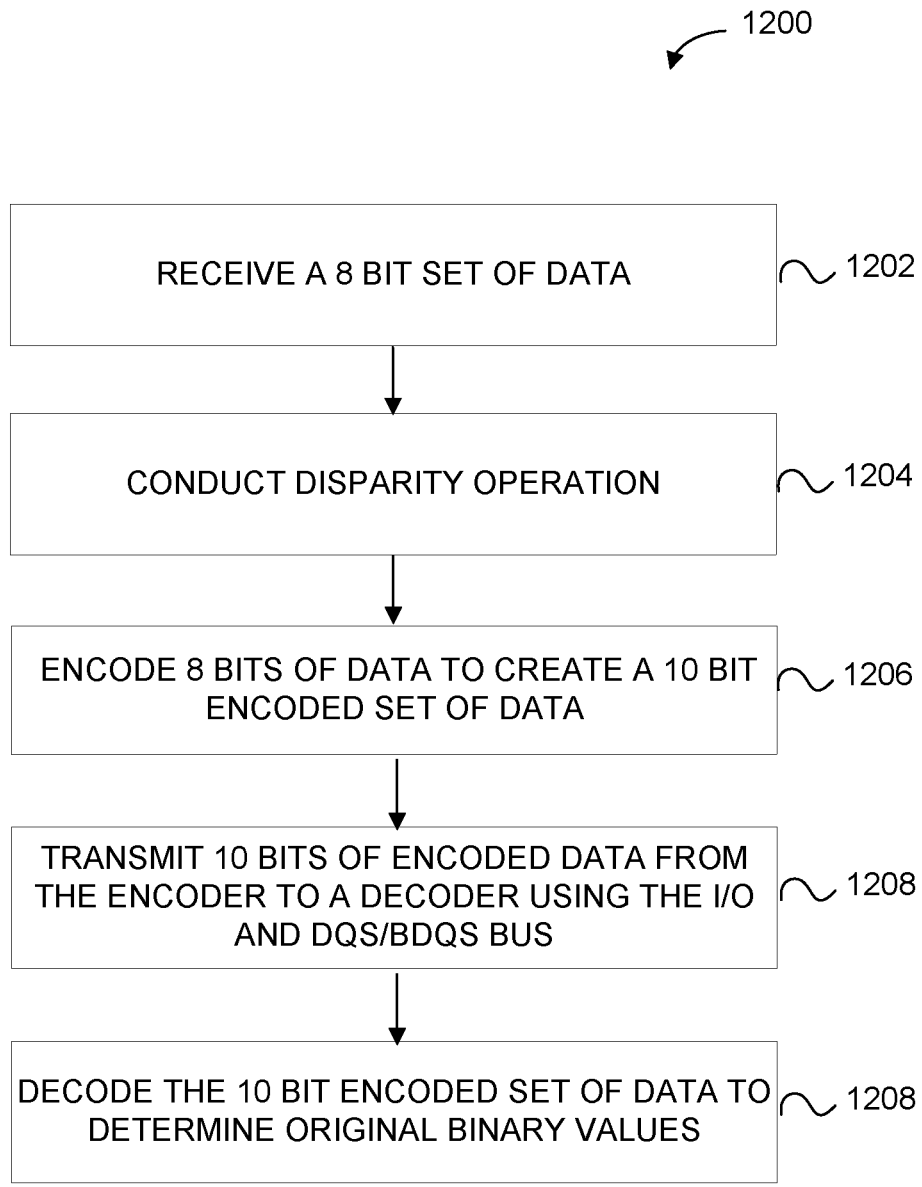
FIG. 12 is an example method of transmitting encoded data, according to one embodiment.

FIG. 12 is an example method, according to one embodiment. The method 1200 includes receiving a set of data comprising 8 bits representing 8 binary values, conducting a disparity operation, encoding the 8 bit set of data to create a 10 bit encoded set of data. The method 1200 further includes decoding the set of 10 bits of data to determine the original 8 binary values.

At activity 1202, the method 1200 includes receiving a set of data comprising 8 bits. Each bit of the 8 bits of data represents a binary value. At activity 1204, the method 1200 includes conducting a disparity operation. The disparity operation determines the number of binary value "1"s and "0s" in a set of bits. The amount of "1s" and "0s" are subtracted from one another to determine whether there is a greater number of "1s" or "0s". If the set of bits includes more 0 bits than 1 bits then the disparity of the set of data is "negative". If the set of bits includes more 1 bits than 0 bits, then the disparity of the set of data is "positive". In one embodiment, the disparity operation occurs on the controller I/O circuit 502. In one embodiment, the disparity operation occurs on the memory die I/O circuit 504. Determining the disparity of the set of data is important since the likelihood of a weak signal (e.g., the occasional signal associated with a lone pulse) can be decreased when a transmitted set of bits comprises an even amount of 1s and 0s (i.e., a "neutral" set). The 8 b/10 b encoding method attempts to choose transmission symbols that maintain a neutral disparity (i.e., an equal number of 1's or 0's).

At activity 1206, the method 1200 includes encoding the 8 bit set of data to create a 10 bit encoded set of data. In one embodiment, the 8 bits of data are encoded according to a 8 b/10 b SerDes encoding scheme. The 8 b/10 b SerDes encoding scheme maps 8 bit sets of data (i.e., halfwords) to 10 bit sets of data, comprising 10 bit symbols, to achieve DC balance and bounded disparity. The 8 bits of data are transmitted as a 10-bit entity. In one embodiment, the 8 bits of data are transmitted along the I/O bus as I/O data signals, and 2 bits of data are transmitted along the DQS bus as a DQS data signal and a BDQS data signal.

At activity 1208, the method 1200 includes decoding the 10 bit encoded set of data to determine the 8 bits of data. Here, the 10 bit encoded set of data is decoded by the memory die I/O circuit 504 to determine the 8 bits of original data. The 8 bits of original data will be sent to the memory structure 126. Because the I/O bus along with the DQS bus allows for 10 bits to be sent from the controller I/O circuit 502 to the memory die I/O circuit, and vice versa, during the 8 b/10 b encoding scheme, adding two additional bits to an original set of 8 bits, will not negatively affect the bandwidth. Thus, the I/O data transfer speeds could be increased to a higher speed with less impact to the data transfer.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A NAND circuit comprising:
    a controller configured to perform a write operation, wherein the controller includes a controller input/output (I/O) circuit; and
    a NAND memory die comprising a memory die I/O circuit communicatively connected to the controller I/O circuit via a plurality of buses, wherein the plurality of buses comprise:
        a bidirectional data strobe (DQS) bus configured to transmit a DQS data signal and an inverse data strobe (BDQS) data signal from the controller I/O circuit to the memory die I/O circuit during the write operation, wherein the DQS data signal represents a binary value and the BDQS data signal represents a binary value,
        a read enable (RE) bus configured to transmit a clock signal between the controller I/O circuit and the memory die I/O circuit during the write operation, and
        an I/O bus configured to transmit a data signal between the controller I/O circuit and the memory die I/O circuit during the write operation, wherein the data signal represents 8 binary values;
    wherein the memory die I/O circuit comprises:
        a first two input multiplexer communicatively connected to an input clock network, a first input receiver and a first dual tail sense amplifier, and
        a second two input multiplexer communicatively connected to the input clock network, the first input receiver and a second dual tail sense amplifier.

2. The NAND circuit of claim 1, wherein the DQS bus is further configured to transmit the DQS clock signal and the BDQS clock signal.

3. The NAND circuit of claim 2, wherein the DQS bus is configured to switch between transmitting the DQS data signal and the BDQS data signal, and transmitting the DQS clock signal and the BDQS clock signal.

4. The NAND circuit of claim 1, wherein the controller is configured to generate the DQS data signal and the BDQS data signal, and transmit the DQS data signal and the BDQS data signal from the controller to the memory die along the DQS bus.

5. The NAND circuit of claim 1, wherein the controller is configured to generate a DQS clock signal and a BDQS clock signal, and transmit the DQS clock signal and BDQS clock signal from the controller to the memory die along the DQS bus.

6. The NAND circuit of claim 5, wherein the controller is configured to switch between sending the DQS clock signal and the BDQS clock signal from the controller to the memory die along the DQS bus, and sending the DQS data signal and the BDQS data signal from the controller to the memory die along the DQS bus.

7. The NAND circuit of claim 1, wherein the first dual tail sense amplifier and the second dual tail sense amplifier are communicatively coupled to an input latch data network.

8. The NAND circuit of claim 1, wherein the first dual tail sense amplifier is communicatively coupled to an input of the first two input multiplexer and an input latch data network, and wherein the second dual tail sense amplifier is communicatively coupled to an input of the second two input multiplexer, and an input latch data network.

9. A NAND circuit comprising:
a controller configured to perform a read operation, wherein the controller includes a controller input/output (I/O) circuit comprising an internal clock configured to provide a controller clock signal to latch data signals during the read operation; and
a NAND memory die comprising a memory die I/O circuit communicatively connected to the controller I/O circuit via a plurality of buses, wherein the plurality of buses comprise:
   a bidirectional data strobe (DQS) bus configured to transmit a DQS data signal and an inverse data strobe (BDQS) data signal from the memory die I/O circuit to the controller I/O circuit during the read operation, wherein the DQS data signal represents a binary value and the BDQS data signal represents a binary value,
   a read enable (RE) bus configured to transmit a clock signal between the memory die I/O circuit and the controller I/O circuit during the read operation, and
   an I/O bus configured to transmit a data signal between the controller I/O circuit and the memory die I/O circuit during the read operation, wherein the data signal represents 8 binary values;
wherein the memory die I/O circuit comprises:
   a first two input multiplexer communicatively connected to an input clock network, a first input receiver and a first dual tail sense amplifier, and
   a second two input multiplexer communicatively connected to the input clock network, the first input receiver and a second dual tail sense amplifier.

10. The NAND circuit of claim 9, wherein the controller I/O circuit is configured to generate a RE clock signal and an inverse RE clock signal.

11. The NAND circuit of claim 9, wherein the memory die I/O circuit is configured to generate the DQS data signal and the BDQS data signal, and transmit the DQS data signal and the BDQS data signal from the memory die to the controller along the DQS bus.

12. The NAND circuit of claim 9, wherein the memory die I/O circuit is configured to generate the DQS data signal and the BDQS data signal, after receiving a RE clock signal and an inverse RE clock signal from the controller I/O circuit.

13. A method of programming a NAND memory array comprising:
   transmitting a clock signal from a controller input/output (I/O) circuit to a memory die I/O circuit along a read enable (RE) bus during a write operation, wherein the RE bus is communicatively connected to the controller I/O circuit and the memory die I/O circuit;
   transmitting 8 bits of data along an I/O bus communicatively connected to the controller I/O circuit and the memory die I/O circuit, wherein each bit of the 8 bits of data, is transmitted as a data signal along the I/O bus; and
   transmitting 2 bits of data along a data strobe signal (DQS) bus communicatively connected to the I/O circuit and receiving circuit, wherein transmitting 2 bits along the DQS comprises:
      transmitting a first DQS data signal along the DQS bus; and
      transmitting a first BDQS data signal along the DQS bus;
   wherein the memory die I/O circuit comprises:
      a first two input multiplexer communicatively connected to an input clock network, a first input receiver and a first dual tail sense amplifier, and
      a second two input multiplexer communicatively connected to the input clock network, the first input receiver and a second dual tail sense amplifier.

14. The method of claim 13, further comprising:
   latching 8-bits of data to the I/O bus during a read operation, wherein the 8-bits are latched using an internal RE clock located on the I/O circuit; and
   latching 2 additional bits of data to the DQS bus during the read operation.

15. The method of claim 13, wherein 8-bits of data are latched to the I/O bus and 2-bits or data are latched to the DQS bus simultaneously during an edge of clock signal.

16. The method of claim 14, wherein a first 10-bits of data are latched to the I/O bus and the DQS bus during a rising edge of the clock signal, and a second 10-bits of data are latched during a falling edge of the clock signal.

* * * * *